(12) United States Patent
Park et al.

(10) Patent No.: US 7,968,894 B2
(45) Date of Patent: Jun. 28, 2011

(54) LED PACKAGE FRAME AND LED PACKAGE HAVING THE SAME

(75) Inventors: Young Sam Park, Seoul (KR); Seung Ick Lee, Kyungki-do (KR); Hun Joo Hahm, Kyungki-do (KR); Hyung Suk Kim, Kyungki-do (KR); Bum Jin Kim, Kyungki-do (KR); Young June Jeong, Kyungki-do (KR); Ho Sik Ahn, Kyungki-do (KR); Jung Kyu Park, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 132 days.

(21) Appl. No.: 12/549,252

(22) Filed: Aug. 27, 2009

(65) Prior Publication Data

US 2009/0321773 A1    Dec. 31, 2009

Related U.S. Application Data

(63) Continuation of application No. 11/319,101, filed on Dec. 28, 2005, now Pat. No. 7,592,631.

(30) Foreign Application Priority Data

Jan. 31, 2005    (KR) .......................... 10-2005-0008773

(51) Int. Cl.
*H01L 27/15* (2006.01)
*H01L 31/12* (2006.01)
*H01L 33/00* (2006.01)

(52) U.S. Cl. .................... 257/81; 257/E33.066; 257/79; 257/433; 438/26; 313/512

(58) Field of Classification Search ........... 257/E23.001, 257/E23.044, E33.066, E23.066, E25.032, 257/432–434, 79, 81, 82, 88, 98–100, 787, 257/790; 438/26; 313/512; 428/446
See application file for complete search history.

(56) References Cited

U.S. PATENT DOCUMENTS

| | | | |
|---|---|---|---|
| 4,026,008 A | 5/1977 | Drees et al. | 29/574 |
| 5,040,868 A | 8/1991 | Waitl et al. | 358/33 |
| 5,208,467 A | 5/1993 | Yamazaki | 257/667 |
| 5,214,495 A | 5/1993 | Kitanishi | 257/80 |
| 5,807,768 A | 9/1998 | Shin | 438/127 |
| 5,814,871 A | 9/1998 | Furukawa et al. | 257/433 |

(Continued)

FOREIGN PATENT DOCUMENTS

CN    2540685    3/2003

(Continued)

*Primary Examiner* — Chris Chu
(74) *Attorney, Agent, or Firm* — Lowe, Hauptman, Ham & Berner, LLP

(57) ABSTRACT

An LED package frame includes an LED chip and a heat conductive member made of high heat conductivity material. The heat conductive member has a receiving part at a lateral portion, and is mounted with the LED chip. A lead-coating assembly configured to be inserted into the receiving part of the heat conductive member, including a lead is inserted at one end into the receiving part of the heat conductive member, and electrically connected to the LED chip. An electrically insulating layer is placed in tight contact between the lead and the receiving part of the heat conductive member isolates the lead from the receiving part. With the lead inserted into the heat conductive member, it is possible to reduce size while maintaining high heat conductivity and stability.

7 Claims, 37 Drawing Sheets

U.S. PATENT DOCUMENTS

| | | | |
|---|---|---|---|
| 5,826,980 A * | 10/1998 | Kouzu et al. | 374/124 |
| 6,274,890 B1 | 8/2001 | Oshio et al. | 257/98 |
| 6,682,205 B2 * | 1/2004 | Lin | 362/555 |
| 7,119,422 B2 | 10/2006 | Chin | 257/666 |
| 7,361,940 B2 * | 4/2008 | Kim et al. | 257/99 |
| 7,737,463 B2 * | 6/2010 | Lee et al. | 257/99 |
| 7,763,478 B2 * | 7/2010 | Loh et al. | 438/22 |
| 7,845,828 B2 * | 12/2010 | Ku | 362/249.02 |
| 7,852,015 B1 * | 12/2010 | Yen et al. | 315/291 |
| 2001/0030866 A1 | 10/2001 | Hochstein | 362/294 |
| 2002/0113244 A1 | 8/2002 | Barnett et al. | 257/99 |
| 2002/0125494 A1 | 9/2002 | Isokawa | 257/99 |
| 2004/0075100 A1 | 4/2004 | Bogner et al. | 257/99 |
| 2004/0135156 A1 | 7/2004 | Takenaka | 257/79 |
| 2004/0251469 A1 | 12/2004 | Yatsuda et al. | 257/100 |
| 2005/0068776 A1 | 3/2005 | Ge | 362/296 |
| 2005/0199900 A1 | 9/2005 | Lin et al. | 257/99 |
| 2005/0236638 A1 | 10/2005 | Tsukagoshi | 257/99 |

FOREIGN PATENT DOCUMENTS

| | | |
|---|---|---|
| CN | 2617939 | 5/2004 |
| JP | 2003-347588 A | 12/2003 |
| JP | 2004-071771 A | 3/2004 |
| JP | 2005-019662 A | 1/2005 |

* cited by examiner

LED PACKAGE FRAME AND LED PACKAGE HAVING THE SAME

RELATED APPLICATION

The present application is a continuation of U.S. application Ser. No. 11/319,101, filed Dec. 28, 2005, which is based on and claims priority from Korea Application Number 2005-8773, filed Jan. 31, 2005, the disclosures of which are hereby incorporated by reference herein in their entirety.

BACKGROUND OF THE INVENTION

1. Field of the Invention

The present invention relates to a high power LED package. More particularly, the invention relates to an LED package frame and a high power LED package incorporating the same that have a lead inserted into a heat conductive member to achieve size-reduction while maintaining high heat conductivity and stability.

2. Description of the Related Art

A Light Emitting Diode (LED) is a semiconductor device that is activated in response to electric current to generate various colors of light. The color of light generated by the LED is mainly determined by chemical components of LED semiconductor. Such LEDs have several merits such as longer lifetime, lower driving voltage, better initial activation characteristics, higher vibration resistance and higher tolerance on repetitive power switching over conventional lighting devices using filaments, and thus demand for them is gradually on the rise.

However, an LED also does not convert current into light for 100%, but produces a considerable amount of heat from an LED chip. Unless heat is properly dissipated, internal components of the LED will suffer from stress owing to their different heat expansion coefficients. So, metal lead frames are provided in the LED to dissipate heat to the outside.

LEDs have been recently used in a backlight unit for a lighting equipment and a large-sized Liquid Crystal Display (LCD). These units require higher power, and thus a so-called high power LED requires a package structure having better heat-dissipation performance.

An example of such a high power LED package has been disclosed in US Patent Application Publication No. 2004/0075100, in the title of "Leadframe and Housing for Radiation-Emitting Component, Radiation-Emitting Component, and a Method for Producing the Component."

As disclosed in this document, a conventional high power LED package is constructed by mounting an LED chip on a heat conductive part made of a metal lump, connecting the LED chip to lead portions, and then molding resin around the heat conductive part, the LED chip and the lead portions so as to form a package body. This construction can effectively dissipate heat from the LED chip to the outside via the heat conductive part while ensuring stability.

This arrangement, however, requires the package body to be resin-molded while the heat conductive part is kept separate from the lead portions, thereby causing disadvantageous size increase to the entire LED package.

SUMMARY OF THE INVENTION

The present invention has been made to solve the foregoing problems of the prior art and it is therefore an object of the present invention to provide an LED package frame that has a lead inserted into a heat conductive member in order to reduce size while maintaining high heat conductivity and stability.

It is another object of the invention to provide an LED package frame that has a lead fixed to a heat conductive member without a jig in order to enable mass production.

It is further another object of the invention to provide an LED package that has a lead inserted into a heat conductive member in order to reduce size while maintaining high heat conductivity and stability.

It is yet another object of the invention to provide an LED package that has a lead fixed to a heat conductive member without a jig in order to enable mass production.

According to an aspect of the invention for realizing the foregoing objects, there is provided an LED package frame in use with a high power LED package, comprising: an LED chip; a heat conductive member made of a lump of high heat conductivity material, the heat conductive member having a receiving part at a lateral portion, and mounted with the LED chip; a lead inserted at one end into the receiving part of the heat conductive member, and electrically connected to the LED chip; and an electrically insulating layer placed in tight contact between the lead and the receiving part of the heat conductive member to separate the lead from the receiving part.

Preferably, the heat conductive member has a column part, and the lead and the receiving part of the heat conductive member are extended in an L shape from the column part of the heat conductive member.

The LED package frame may further comprise a second lead, wherein the heat conductive member has a caved-in second receiving part receiving and contacting the second lead.

Preferably, the heat conductive member has a column part, and the leads and the receiving parts of the heat conductive member are extended in an L shape from the column part of the heat conductive member.

Preferably, the lead is at the one end surrounded by the heat conductive member, with the electrically insulating layer being interposed between the lead and the heat conductive member.

Preferably, the heat conductive member has a reflector extended from the periphery of the heat conductive member beyond the LED chip to form a cavity around the LED chip.

Furthermore, the LED package frame may further comprise a base injection-molded around the heat conductive member to seal the periphery of the conductive member and the one end of the lead.

According to another aspect of the invention for realizing the foregoing objects, there is provided an LED package comprising: an LED package frame as described above; and a package body made of resin to seal the LED package frame to an extent that at least a part of the heat conductive member opposite to the LED chip is exposed and the other end of the lead is projected out of the package body.

According to further another aspect of the invention for realizing the foregoing objects, there is provided an LED package comprising: an LED package frame as described above; an outside wall injection-molded around the LED package frame to seal the periphery of the heat conductive member and partially the lead in a portion adjacent to the heat conductive member while forming a cavity therein; and a transparent resin filled in the cavity.

The LED package may further comprise a layer of high reflectivity material formed on an inside surface of the outside wall.

According to yet another aspect of the invention for realizing the foregoing objects, there is provided an LED package comprising: an LED package frame as described above; and a transparent resin filled in the cavity.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
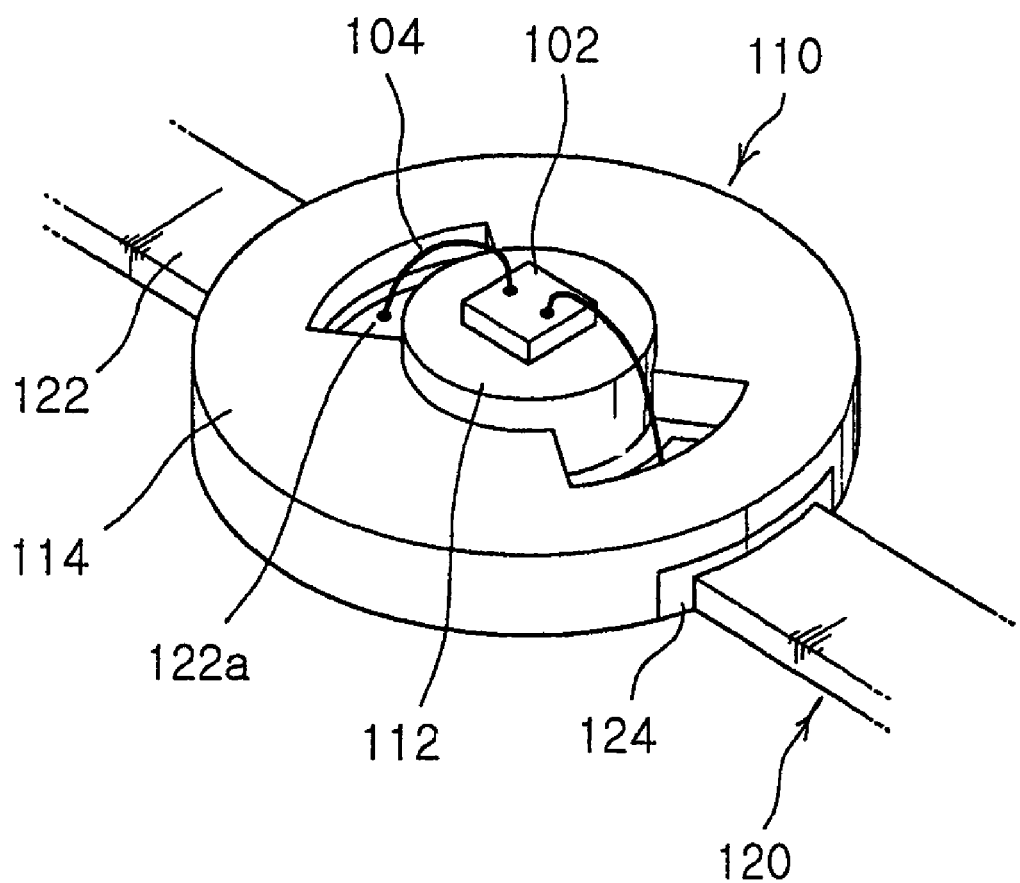
FIG. 1 is a perspective view illustrating a first embodiment of the LED package frame according to the invention.
Figure 2:
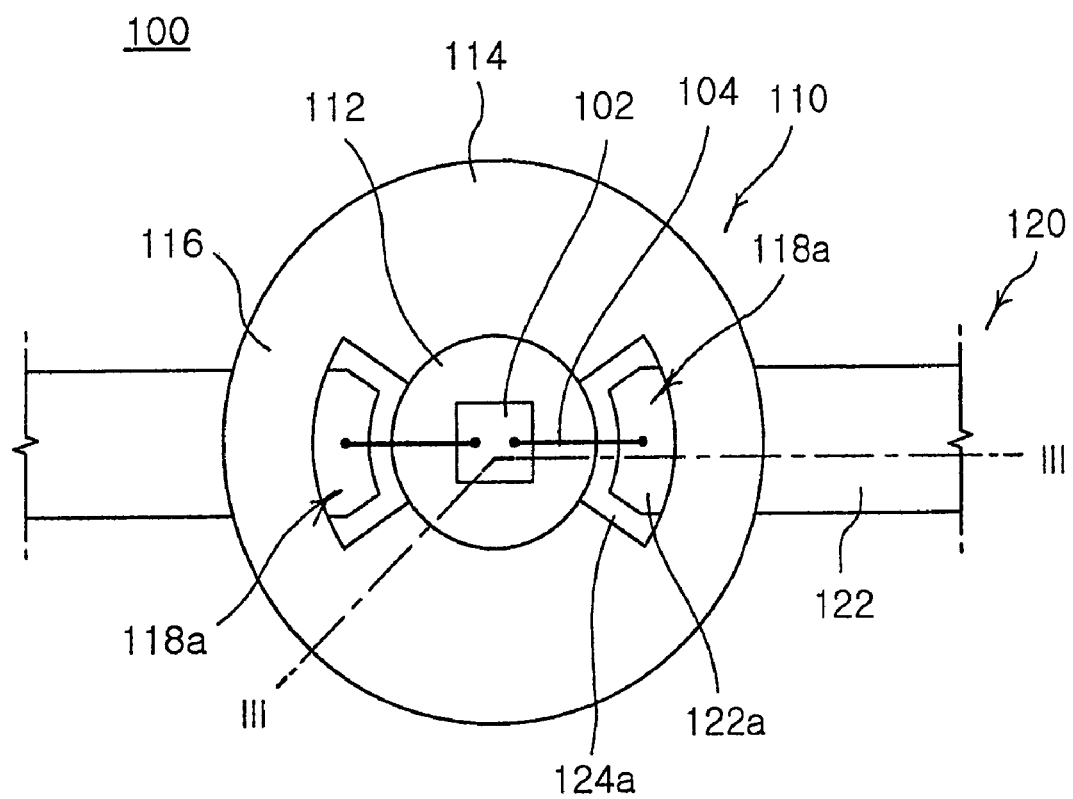
FIG. 2 is a plan view of the LED package frame shown in FIG. 1.
Figure 3:
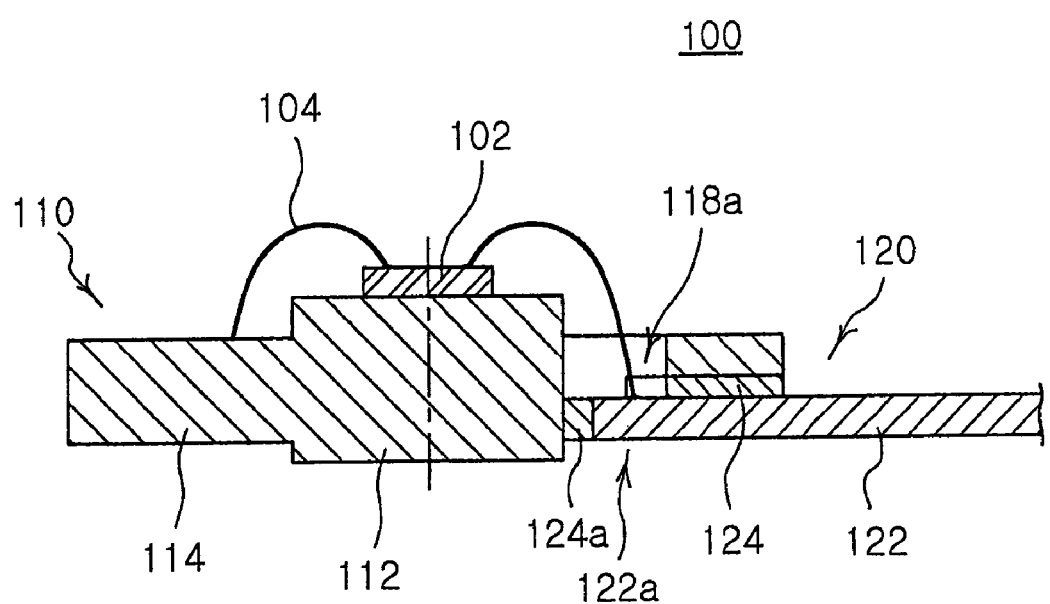
FIG. 3 is a cross-sectional view taken along the line III-III in FIG. 2.
Figure 4:
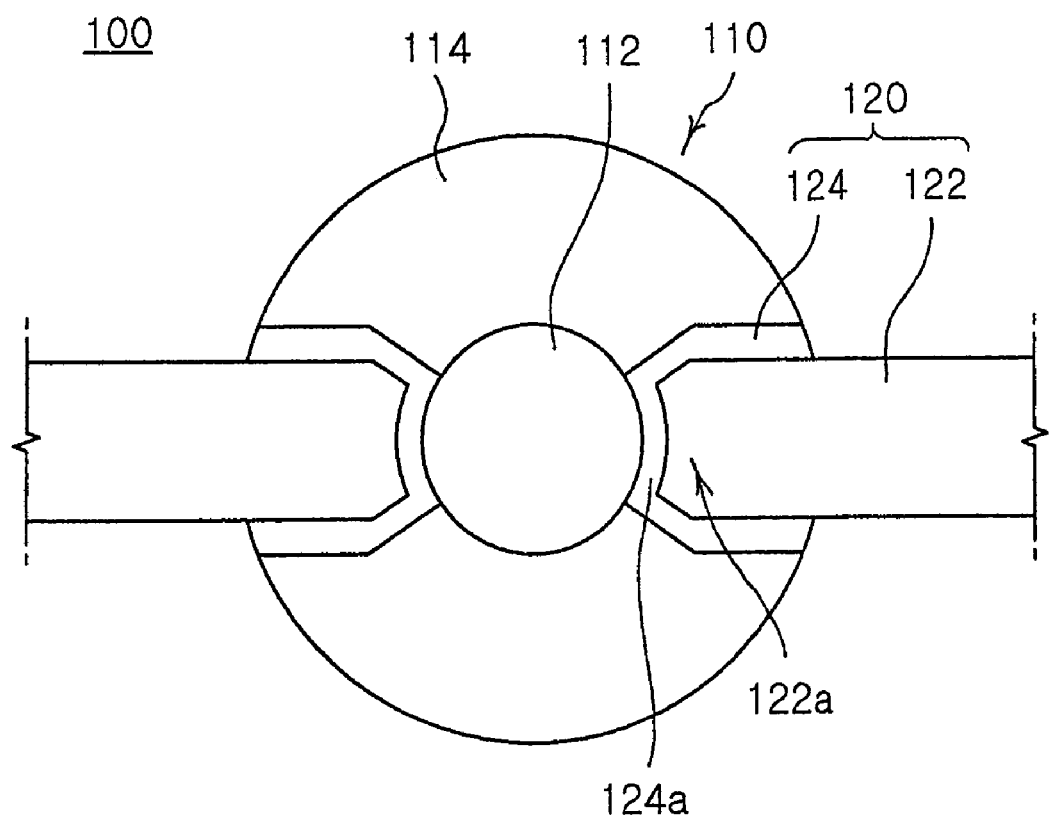
FIG. 4 is a bottom view of the LED package frame shown in FIG. 1.
Figure 5:
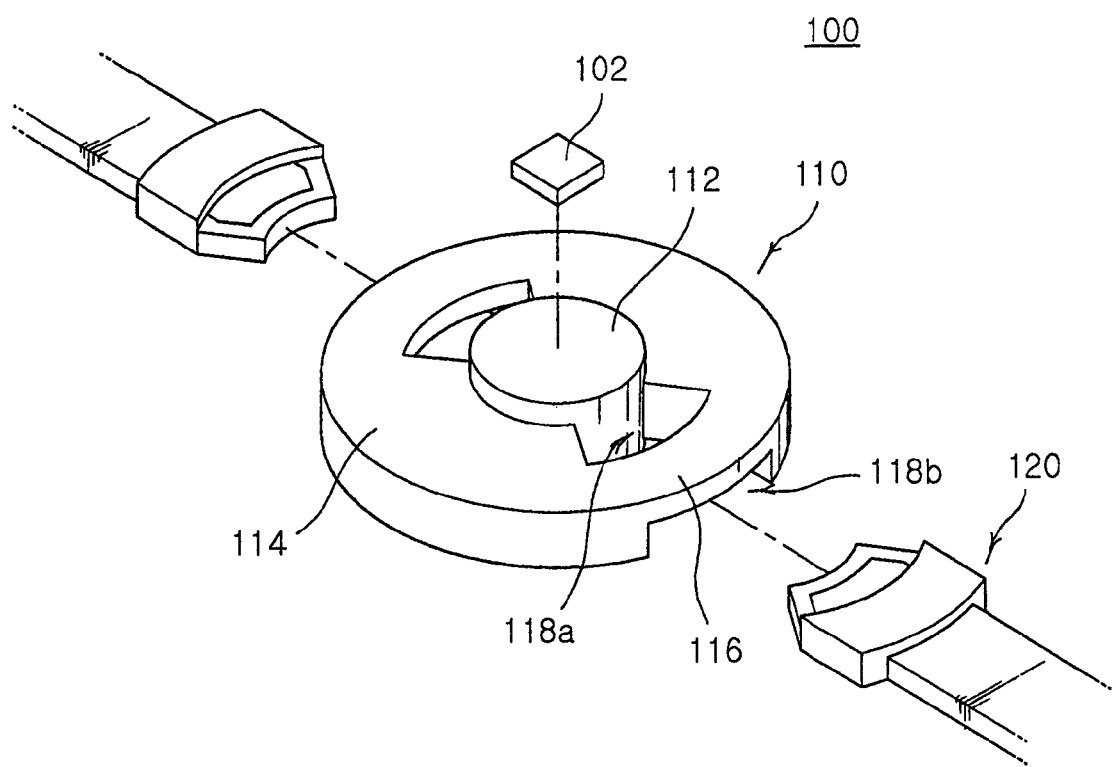
FIG. 5 is an exploded perspective view of the LED package frame shown in FIG. 1.
Figure 6:
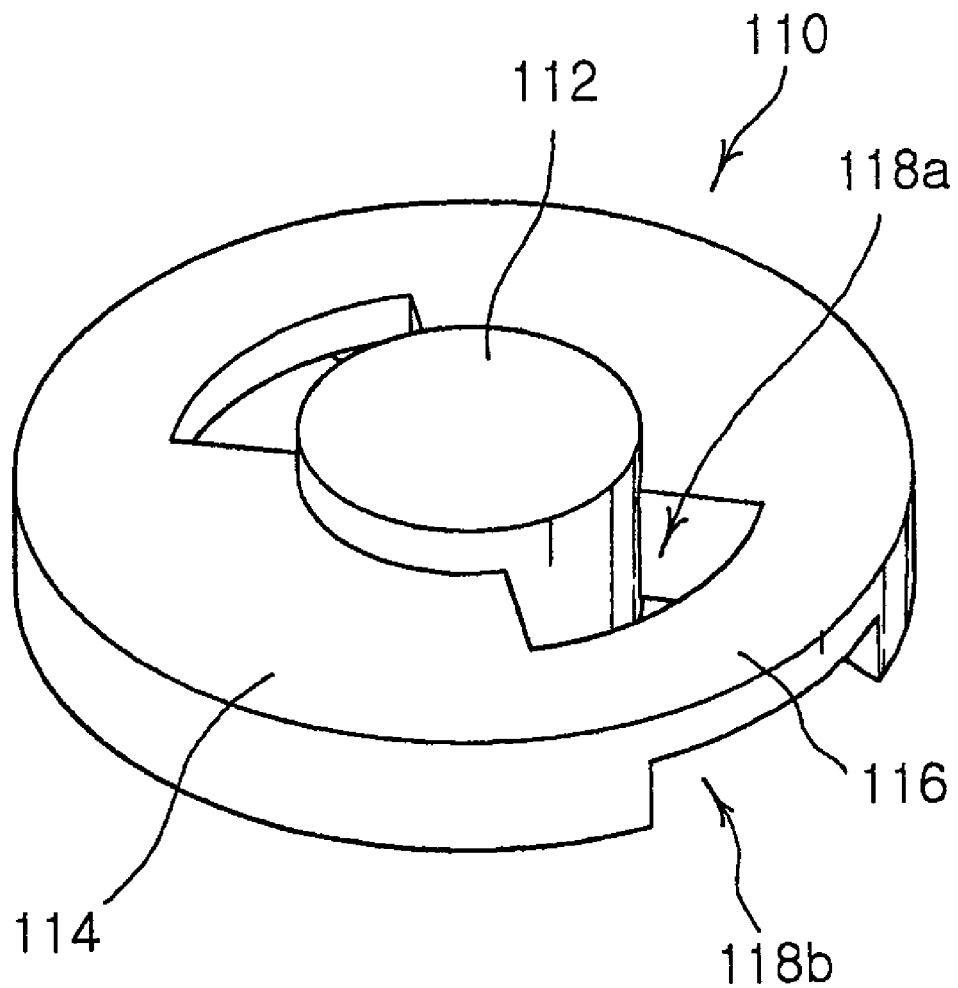
FIG. 6 is a perspective view of a heat conductive member of the LED package frame shown in FIG. 5.
Figure 7:
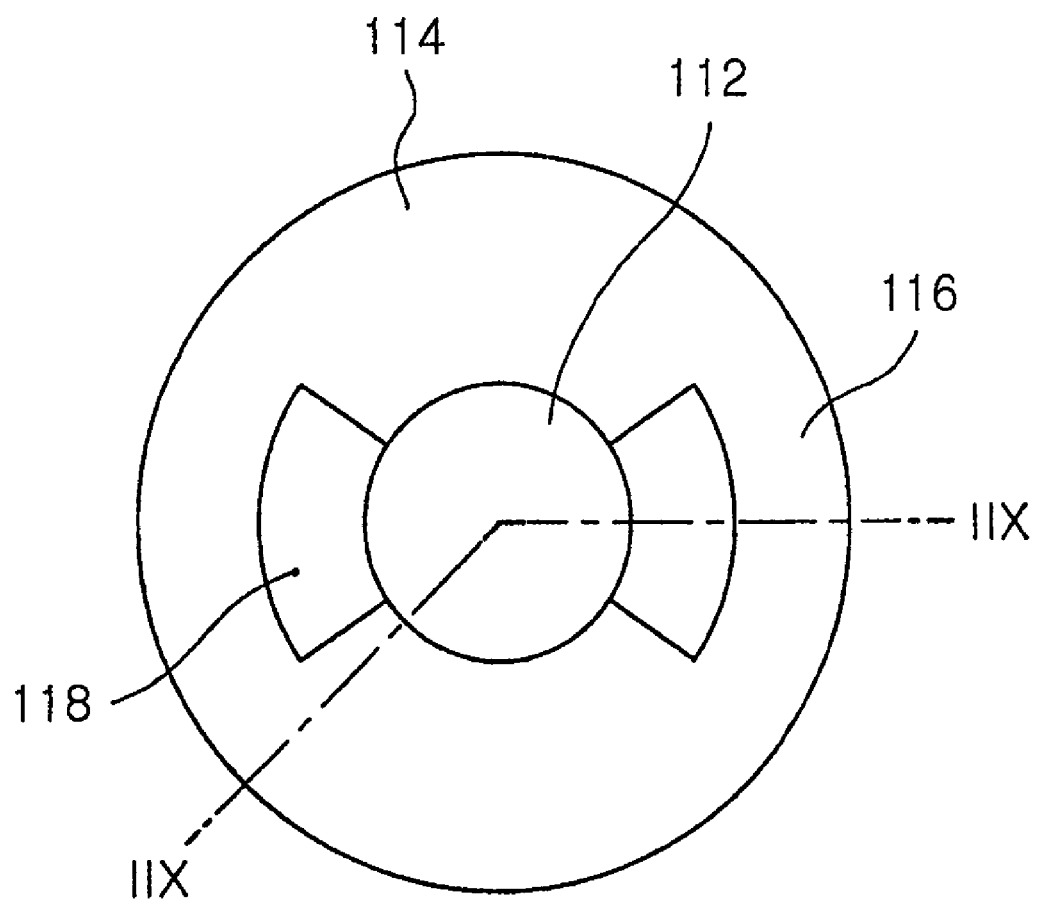
FIG. 7 is a plan view of the heat conductive member shown in FIG. 6.
Figure 8:
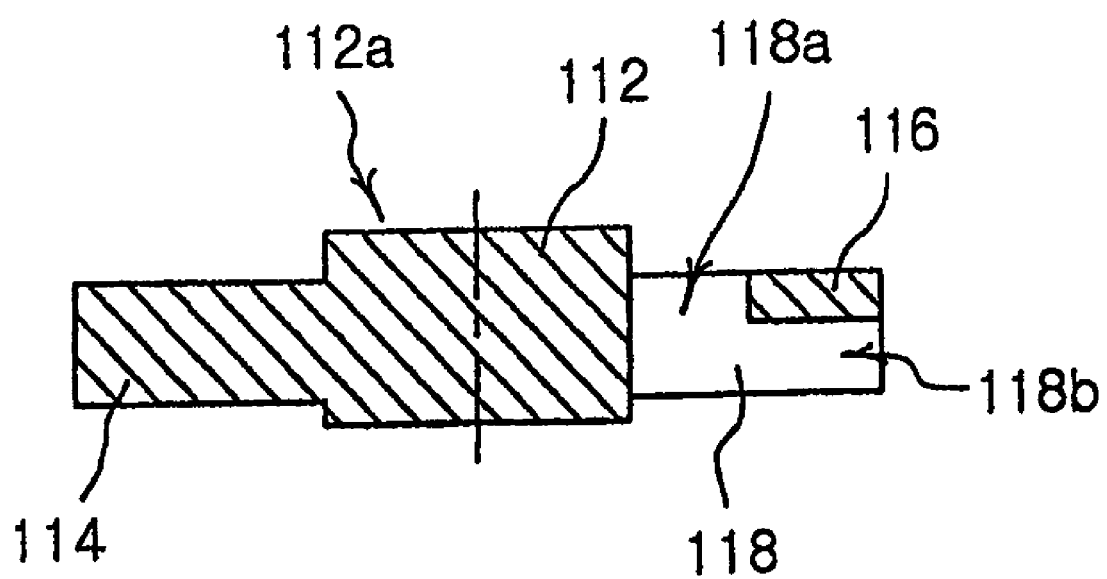
FIG. 8 is a cross-sectional view taken along the line IIX-IIX in FIG. 7.
Figure 9:
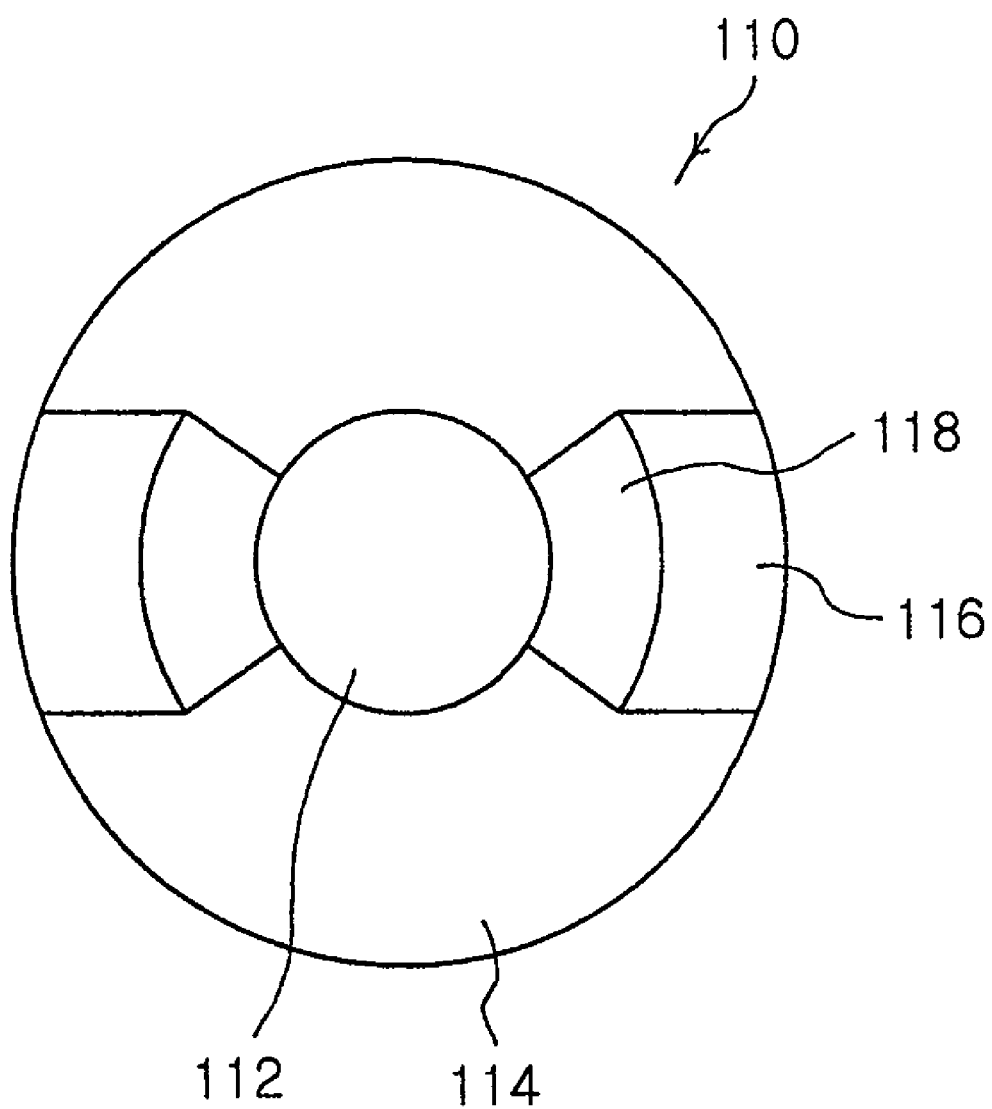
FIG. 9 is a bottom view of the heat conductive member shown in FIG. 6.

Preferred embodiments of the present invention will now be described in detail with reference to the accompanying drawings.

A first embodiment of the LED package frame according to the invention is shown in FIGS. 1 to 11. As shown in FIGS. 1 to 11, the LED package frame 100 of this embodiment includes an LED chip 102, a heat conductive member 110 mounted with the LED chip 102 and a pair of lead-coating assemblies 120 inserted into the heat conductive member 110.

Referring to FIGS. 6 to 9 first, the heat conductive member 110 is a lump of high heat conductivity material, and has an overall disk-shaped configuration with a protruded central portion. The material of the heat conductive member 110 may be any of Cu, Ag, Al, Mo, Fe, Ni, W and alloys thereof. Alternatively, the heat conductive member 110 may be plated or coated with any one of Ni, Ag, Au and alloys thereof.

A cylindrical column part 112 is formed in the center of the heat conductive member 110, and a pair of periphery parts 114 and a pair of connecting parts 116 are formed around the column part 112. The periphery parts 114 are integrally extended from the column part 112 to the outside, so that receiving parts 118 are formed on both sides of the column 112 between the periphery parts 114. The connecting parts 116 are separated from the column part 112 by the receiving parts 118, but connected between the periphery parts 114. In this way, the heat conductive member 110 is formed in an integral structure.

Each of the receiving parts 118 is an L-shaped space that is divided into an open region 118a between the column 112 and the connecting part 116 and a receiving region 118b below the connecting part 116.

Figure 10:
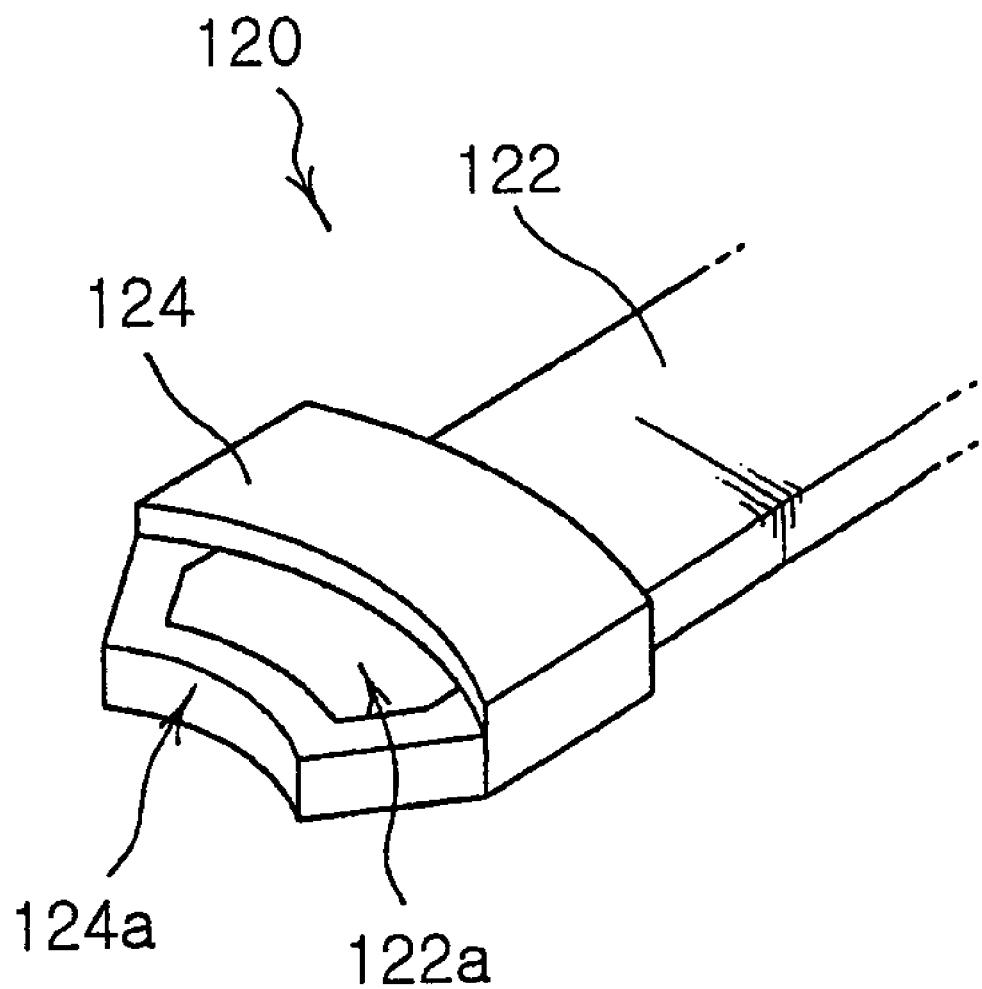
FIG. 10 is a perspective view of a lead-coating assembly of the LED package frame shown in FIG. 5.
Figure 11:
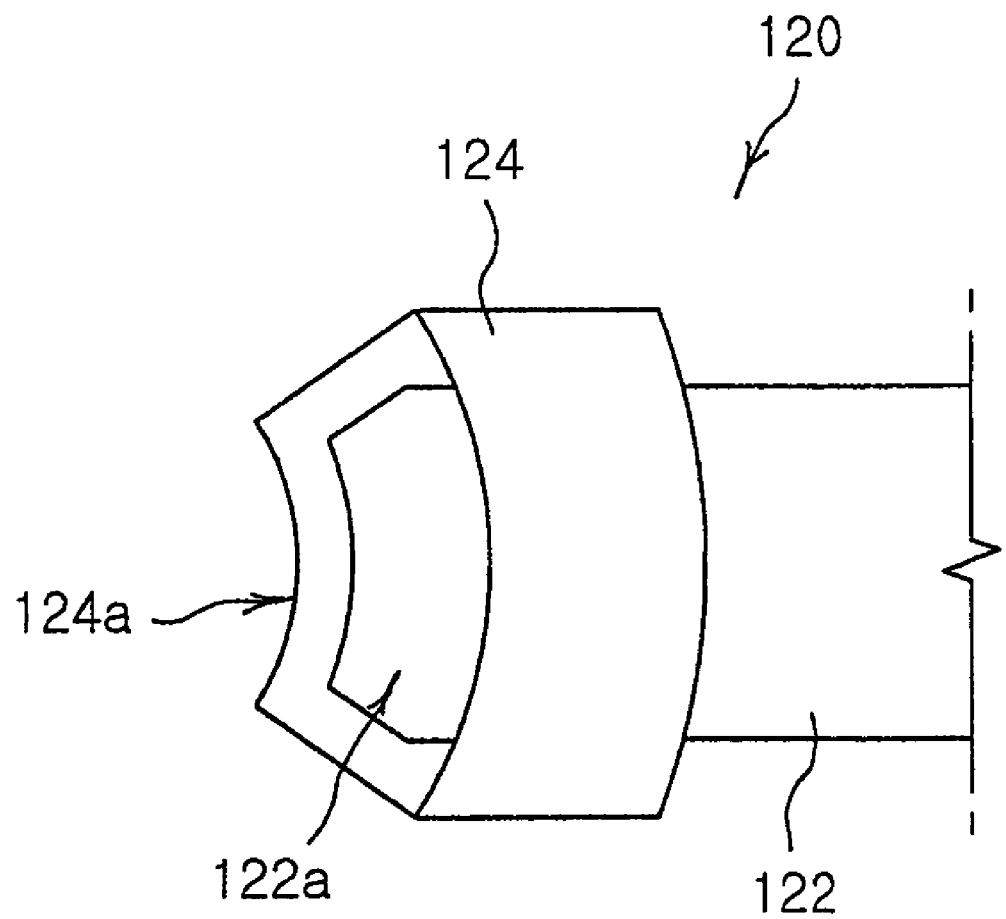
FIG. 11 is a plan view of the lead-coating assembly shown in FIG. 10.

Now referring to FIGS. 10 and 11, the lead-coating assembly 120 includes a lead 122 made of high electric conductivity metal and an isolating layer or insulation coating 124 coated on the lead 122 around the front end 122a thereof. The insulation coating 124 has a front end portion 124a that is also coated on front and lateral portions of the front end 122a, exposing the front end 122a of the lead 122 from above.

The lead 122 may be made of any one of Cu, Ni, Fe and alloys thereof. Alternatively, the lead 122 may be coated with any one of Ni, Ag, Au and alloys thereof. The insulation coating 124 is made of any one of glass, Liquid Crystal Polymer (LCP), epoxy and so on, and preferably selected from any materials that is deformable at a high temperature.

Examining the assembled LED package frame 100, the lead 122 is inserted into the receiving region 118b so that the front end 122a of the lead 122 is exposed from above through the open region 118a. The insulation coating 124 is interposed between the lead 122 and the periphery and connecting parts 114 and 116 to prevent contact between them, and the insulation coating front end 124a is interposed between the front end 122a of the lead 122 and the column part 112 to prevent contact between them. Besides, the insulation coating 124 is deformed at a high temperature to seal and bond between the lead 122 and the heat conductive member 110.

The LED chip 102 is fixed onto a column top 112a of the heat conductive member 110, preferably by adhesive and so on. The LED chip 102 is also electrically connected to the lead front ends 122a of the lead-coating assemblies 120 by wires 104. The wires 104 are connected to the lead front ends 122a through the open regions 118a of the receiving parts 118.

Alternatively, the LED chip 102 may be mounted on the heat conductive member 110 by mounting a pattern-printed pad on the column top 112a, seating the LED chip 102 on the pad, connecting the LED chip 102 to the pad by wires or solder bumps, and then connecting patterns of the pad to the lead front ends 122a by wires. Preferably, the pad is made of flexible or soft material to protect the LED chip 102 from external impact.

With the package frame 100 of the invention, it is possible to reduce the entire size remarkably since the lead-coating assembly 120 is coupled with the heat conductive member 110 through the insertion into the receiving region 118b of the receiving part 118. Also, the insulation coating 124 and the coating front end 124a function to prevent the lead front end 122a of the lead-coating assembly 120 from directly contacting the heat conductive member 110. So, a plurality of package frames 100 of the invention can be mounted on a metal PCB without causing any short-circuit.

Figure 12:
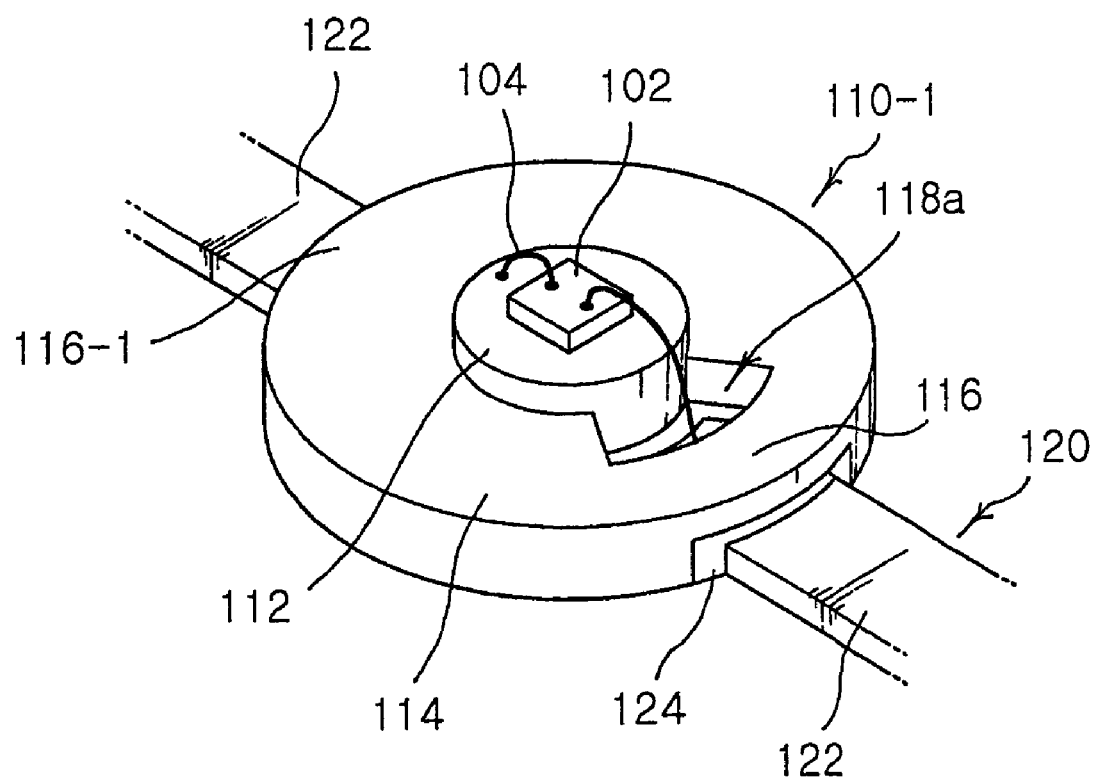
FIG. 12 is a perspective view illustrating a second embodiment of the LED package frame according to the invention.
Figure 13:
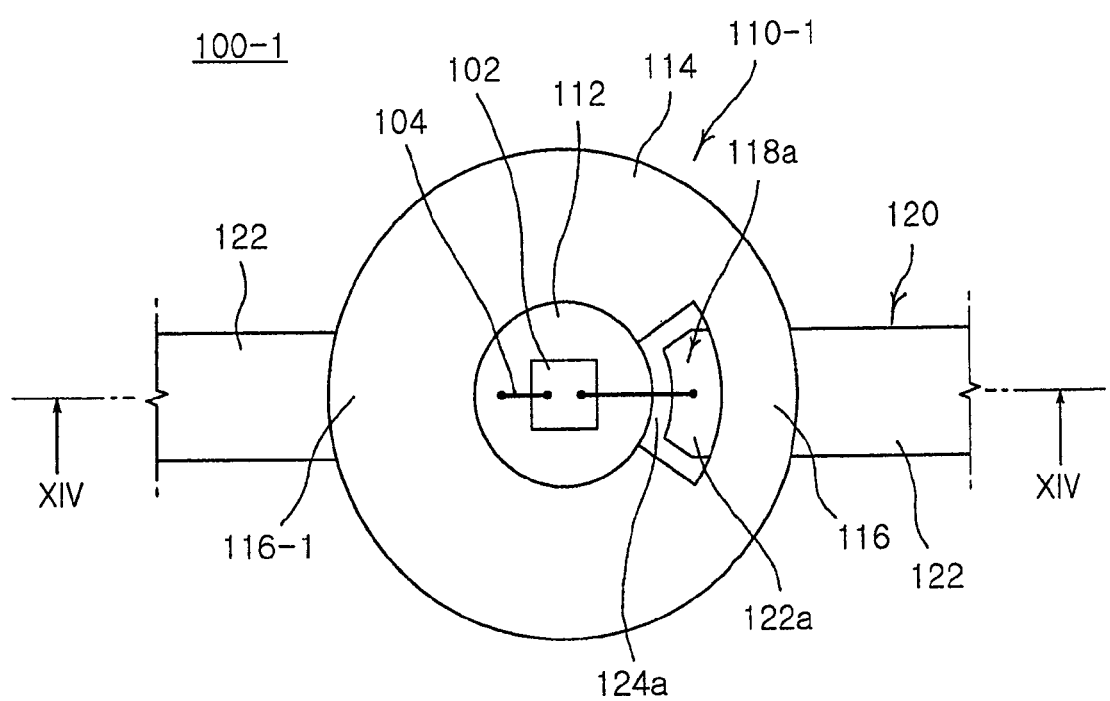
FIG. 13 is a plan view of the LED package frame shown in FIG. 12.
Figure 14:
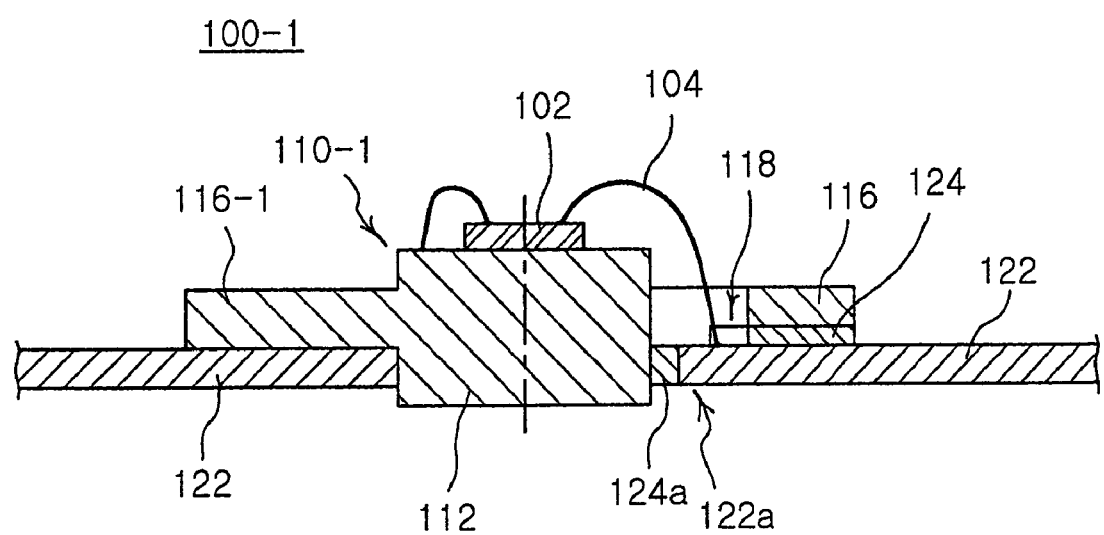
FIG. 14 is a cross-sectional view taken along the line XIV-XIV in FIG. 13.

FIGS. 12 to 14 illustrate a second embodiment of the LED package frame according to the invention. As shown in FIGS. 12 to 14, the LED package frame 100-1 includes an LED chip 102, a heat conductive member 110-1 mounted with the LED chip 102. The LED package frame 100-1 also includes a lead-coating assembly 120 and a lead 122 which are inserted into the heat conductive member 110. The LED package frame 100-1 of this embodiment and the LED package 100 of the first embodiment are similar in their construction. So, the same reference signs are used to designate the same components without repeatedly describing them.

A receiving part 118 having the same configuration as that of the first embodiment is formed in one lateral part of the heat conductive member 110-1, whereas a second connecting part 116-1 opposed to the receiving part 118 directly contacts the lead 122. The LED chip 102 is electrically connected to a lead front end 122a and a column part 112 by wires 104. This enables the heat conductive member 110-1 to function as a lead.

Alternatively, the heat conductive member 110-1 can be directly connected to an external power source by omitting the lead 122.

Figure 15:
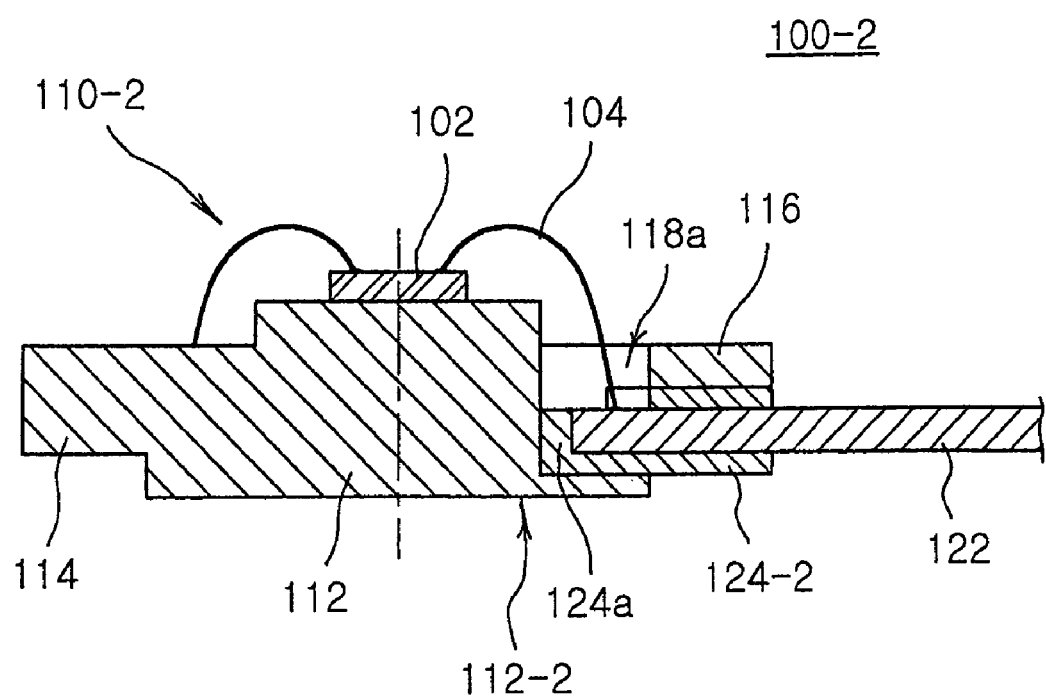
FIG. 15 is a cross-sectional view illustrating a third embodiment of the LED package frame according to the invention, in a position corresponding to that of FIG. 3.

FIG. 15 illustrates a third embodiment of the LED package frame according to the invention. As shown in FIG. 15, the LED package frame 100-2 of this embodiment and the LED package 100 of the first embodiment are similar in their construction. So, the same reference signs are used to designate the same components without repeatedly describing them.

In the LED package frame 100-2 of this embodiment, the bottom 112-2 of a column part 122 is extended radially without overlapping with a lead-coating assembly 122, and an insulation coating 124-2 is wrapped around a portion front end of a lead 122 so that the lead 122 does not contact the column bottom 112-2. With this construction, the lead-coating assembly can be more stably coupled with the heat conductive member 110-2.

Figure 16:
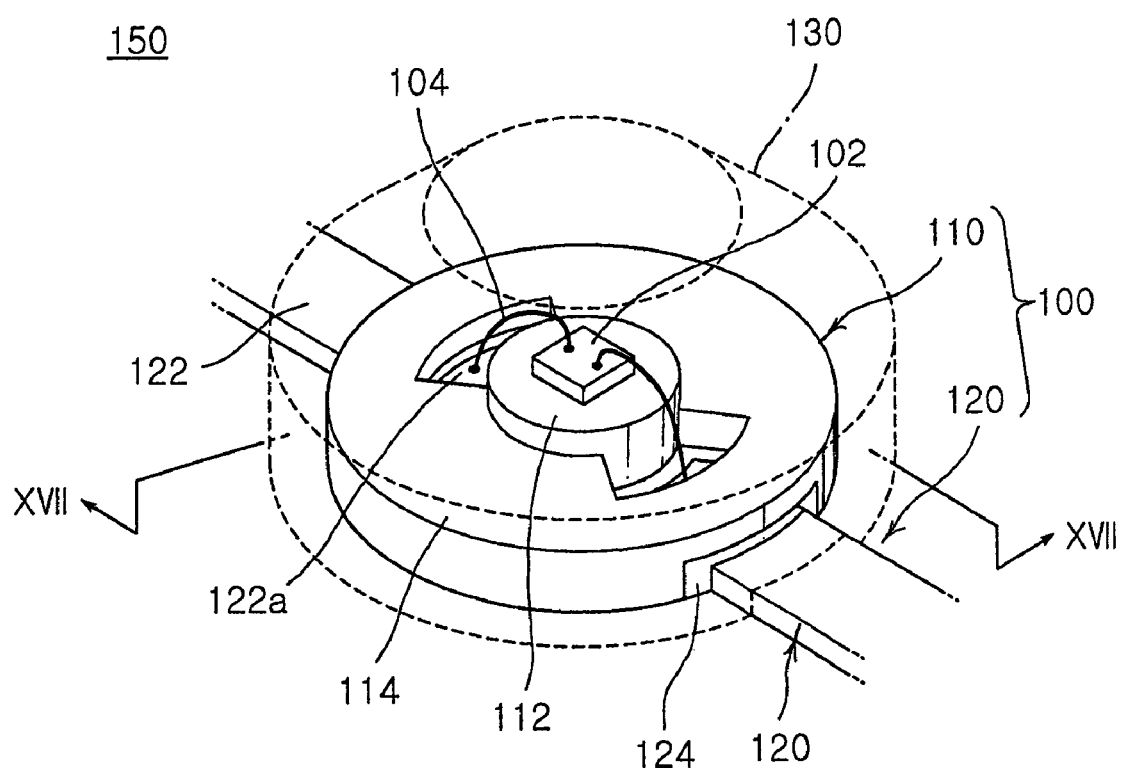
FIG. 16 is a perspective view illustrating a first embodiment of an LED package according to the invention.
Figure 17:
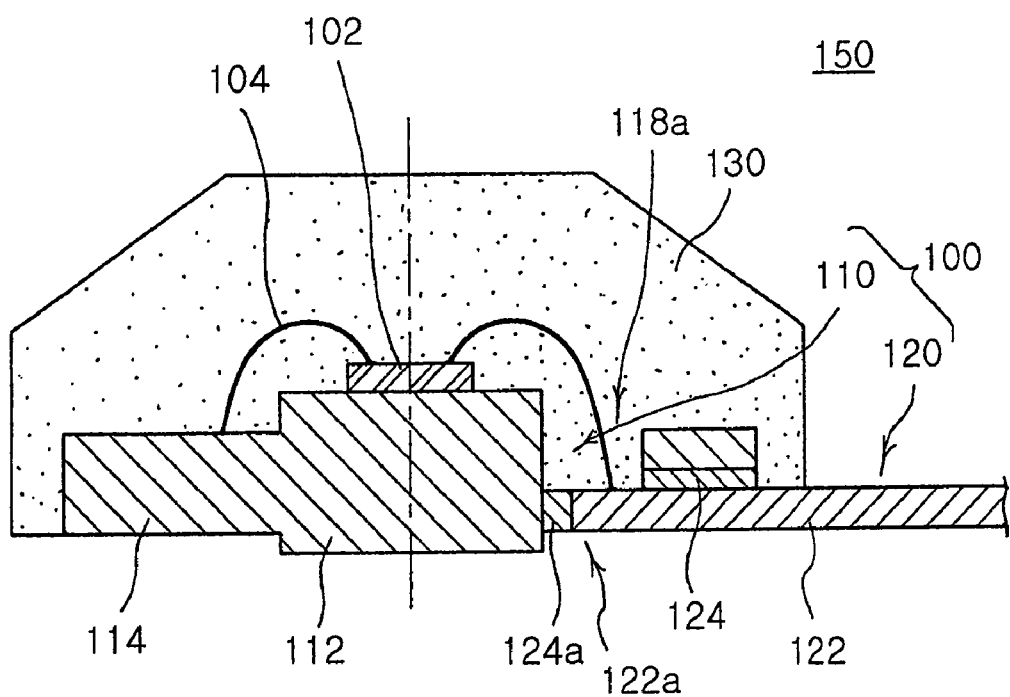
FIG. 17 is a cross-sectional view taken along the line XVII-XVII in FIG. 16.

FIGS. 16 and 17 illustrate a first embodiment of the LED package according to the invention. The LED package 150 includes an LED package frame 100 as shown in FIGS. 1 to 5 and a package body 130 made of transparent resin to mold the LED package frame 100. The package body 130 can promote more stable bonding between the heat conductive member 110 and the lead-coating assembly 120 while protecting the LED chip 102 and the like from the external environment or impact.

Figure 18:
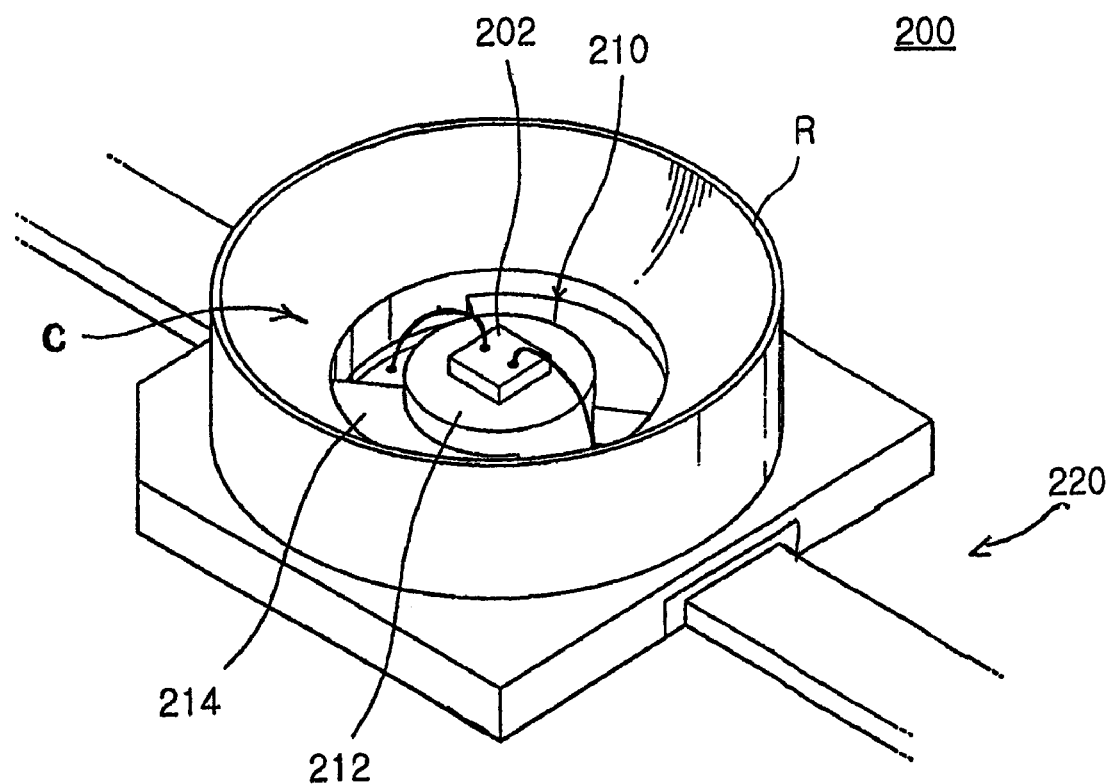
FIG. 18 is a perspective view illustrating a second embodiment of the LED package according to the invention.
Figure 19:
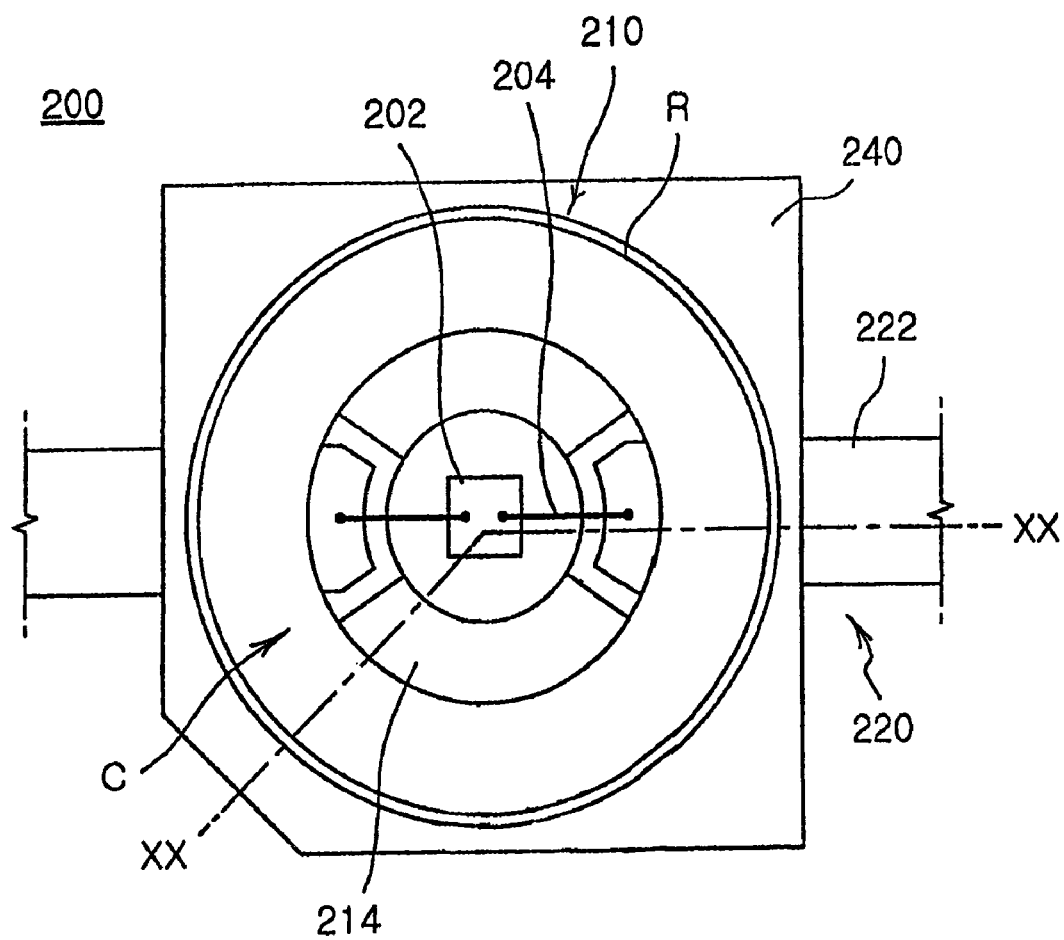
FIG. 19 is a plan view of the LED package shown in FIG. 18.
Figure 20:
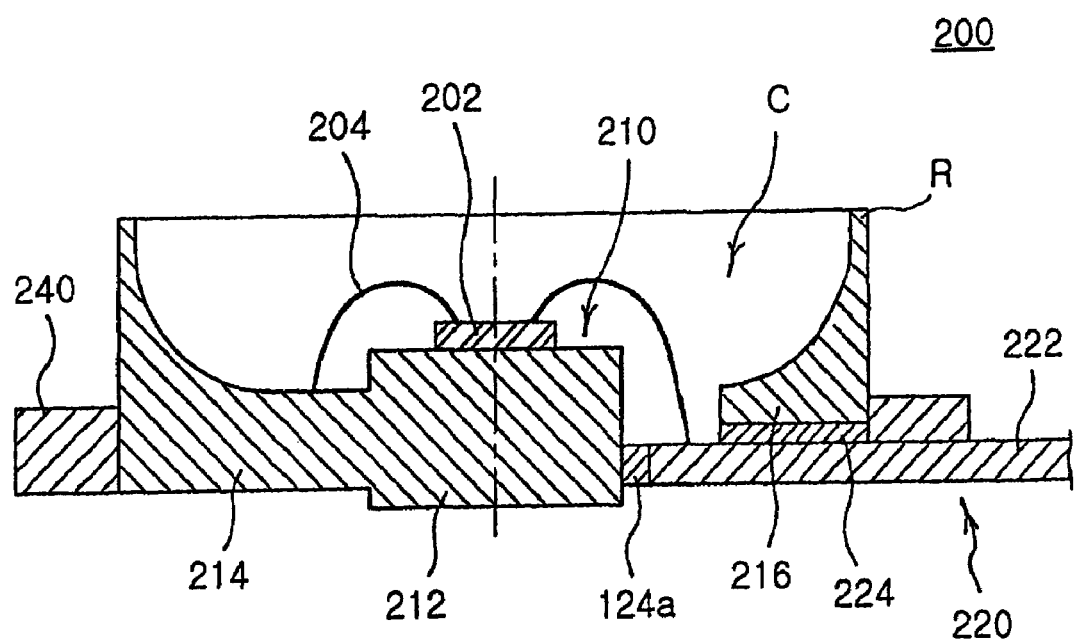
FIG. 20 is a cross-sectional view taken along the line XX-XX in FIG. 19.

FIGS. 18 to 20 illustrate a second embodiment of the LED package according to the invention. As shown in FIGS. 18 to 20, the LED package 200 of this embodiment includes an LED chip 202, a package frame 210 mounted with the LED chip 202 and a pair of lead-coating assemblies 120 inserted into the package frame 210.

Comparing the LED package 200 with the LED package 150 shown in FIGS. 16 and 17 and with the LED package frame 100 shown in FIGS. 1 to 11, the package frame 210 has substantially the same construction as that of the LED package frame 100 except that periphery parts 214 and connecting parts 216 are further extended away from the center and a reflector R is integrally extended upward from the periphery and connecting parts 214 and 216. So, the same reference signs are used to designate the same components without repeatedly describing them.

The reflector R has a concave semicircular cavity C therein, which is filled with transparent resin to protect the LED chip 202 from outside. The reflector R may be made of any one of Cu, Ag, Al, Mo, Fe, Ni, W and alloys thereof. Alternatively, the reflector R may be plated or coated with any of Ni, Ag, Au and alloys thereof.

Also a base is formed around a lower part of the package frame 210 by for example forming or molding in order to ensure stable mounting of the package 200 on a metal PCB and so on.

Figure 21:
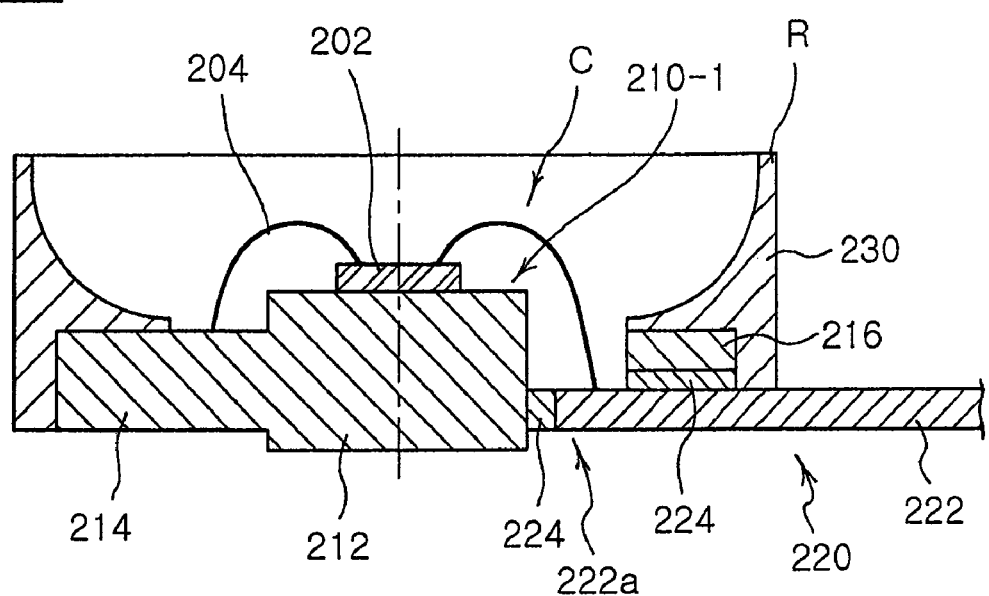
FIG. 21 is a cross-sectional view illustrating a third embodiment of the LED package according to the invention, in a position corresponding to that of FIG. 20.
Figure 22:
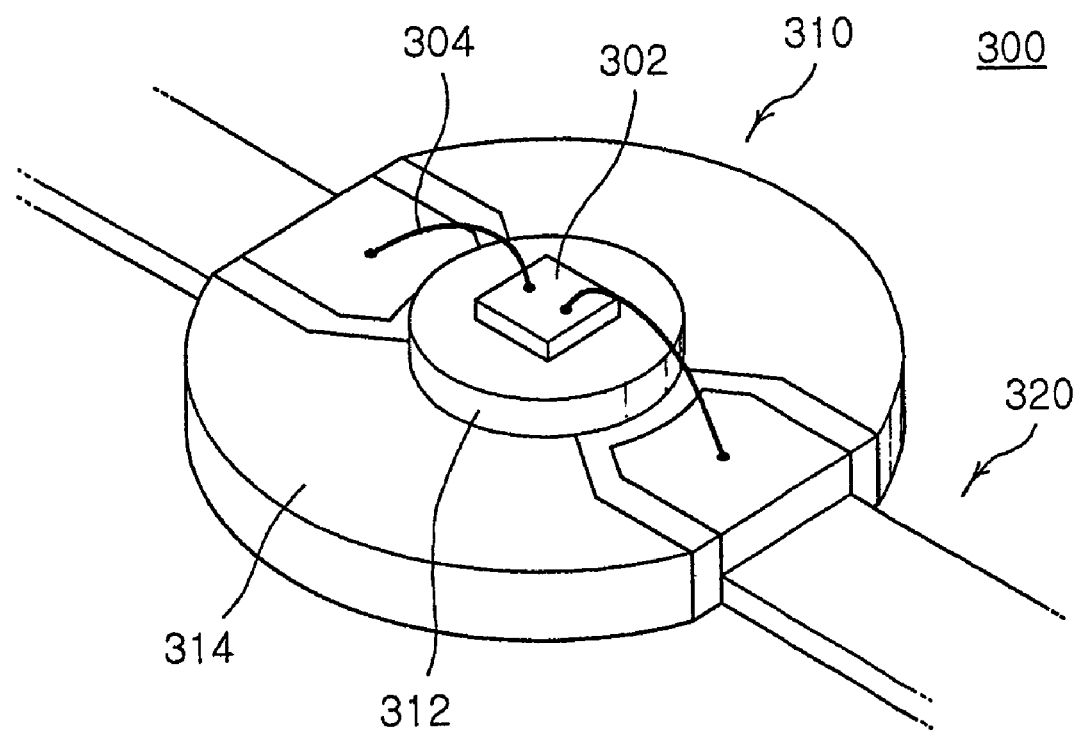
FIG. 22 is a perspective view illustrating a fourth embodiment of the LED package frame according to the invention.
Figure 23:
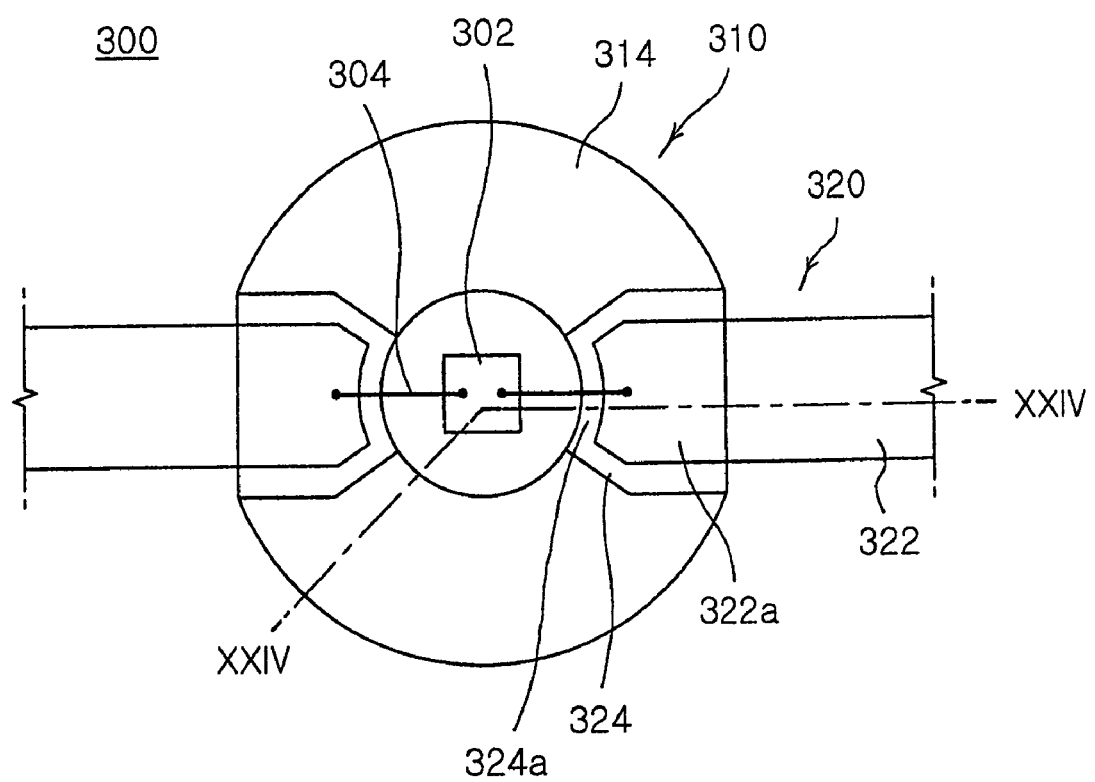
FIG. 23 is a plan view of the LED package frame shown in FIG. 22.
Figure 24:
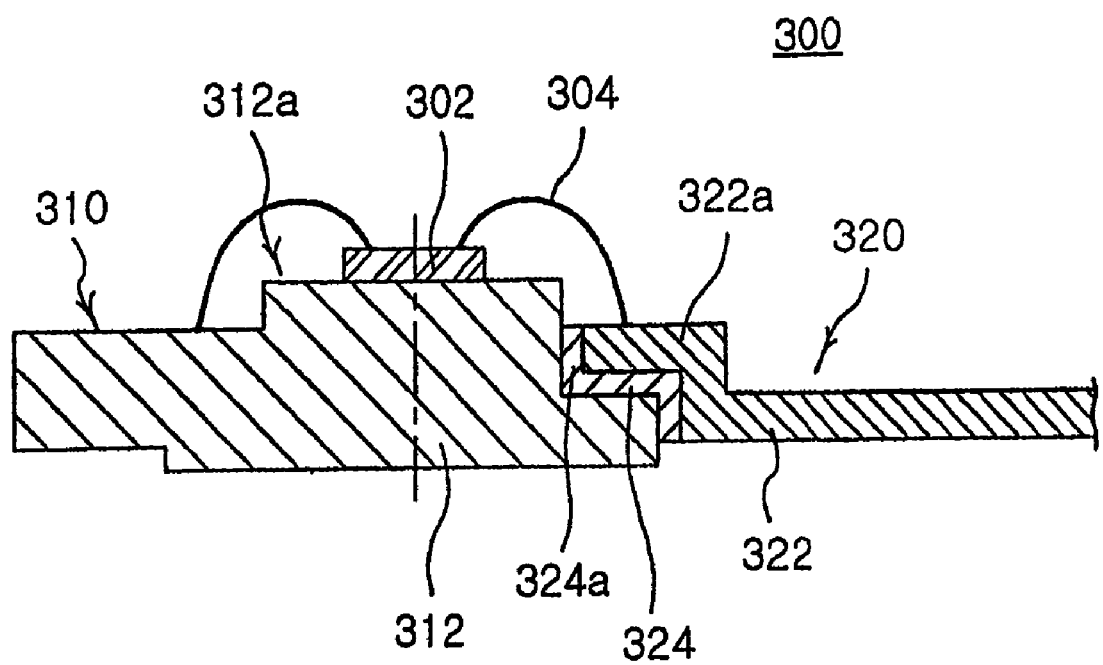
FIG. 24 is a cross-sectional view taken along the line XXIV-XXIV in FIG. 23.
Figure 25:
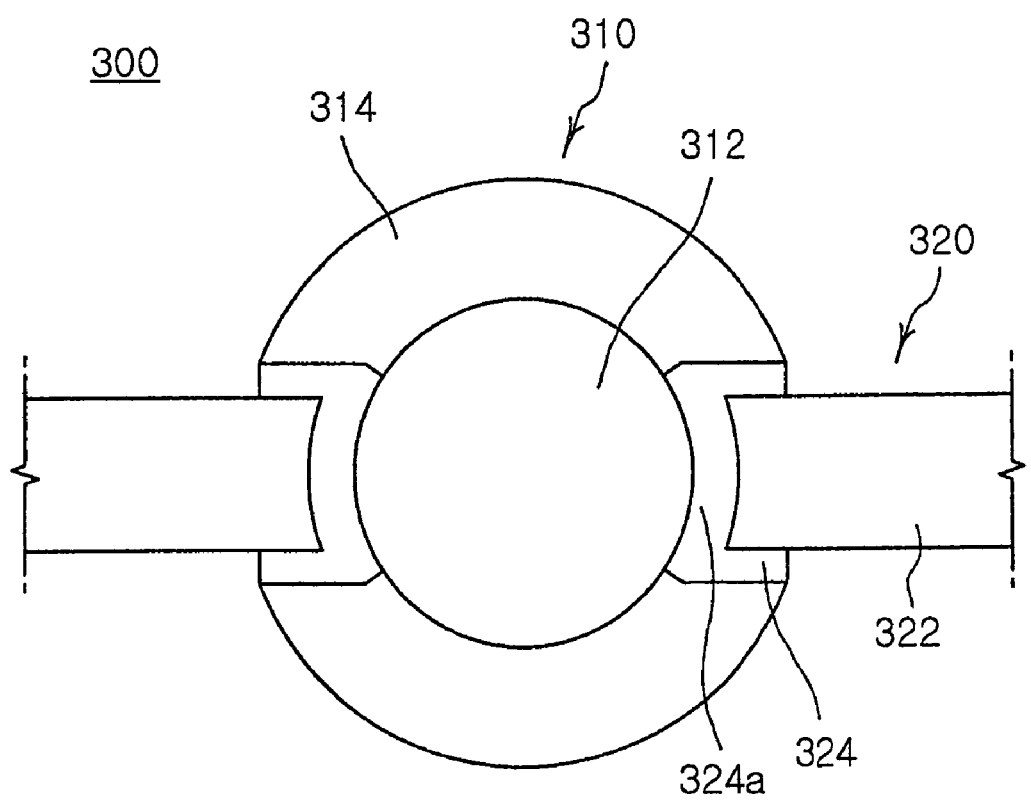
FIG. 25 is a bottom view of the LED package frame shown in FIG. 22.
Figure 26:
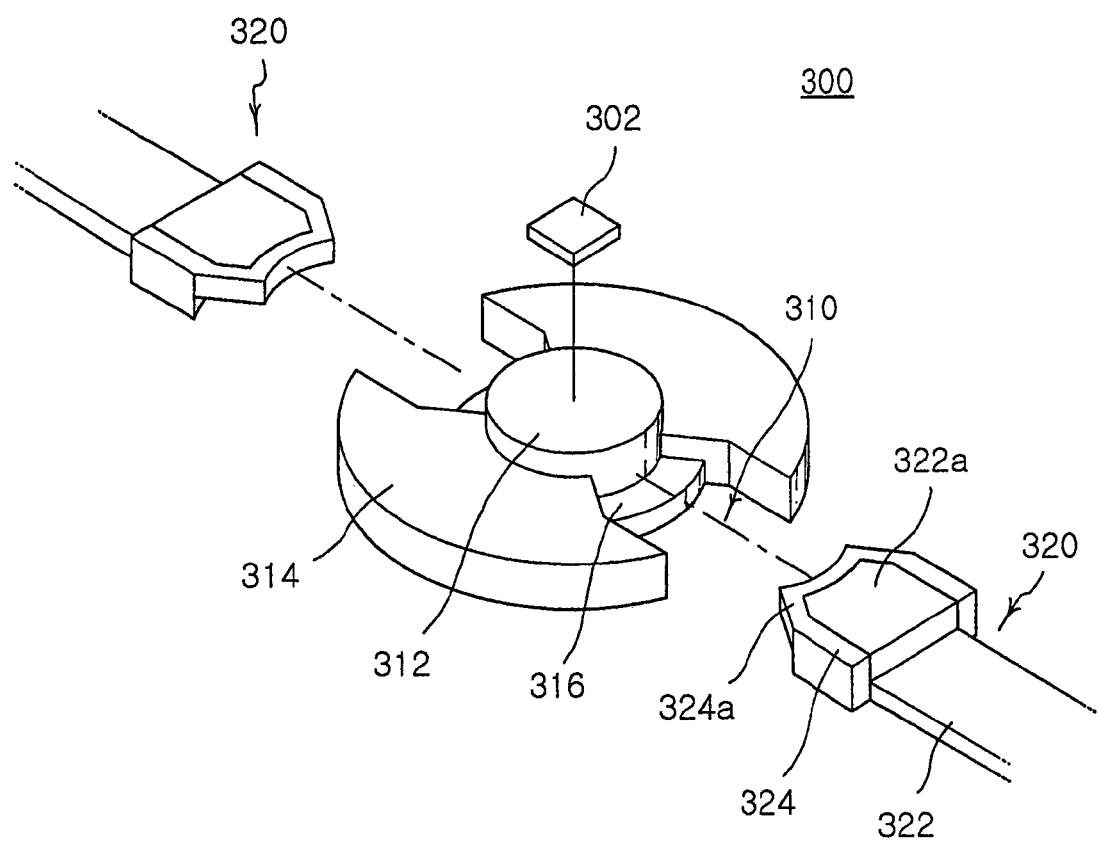
FIG. 26 is an exploded perspective view of the LED package frame shown in FIG. 22.
Figure 27:
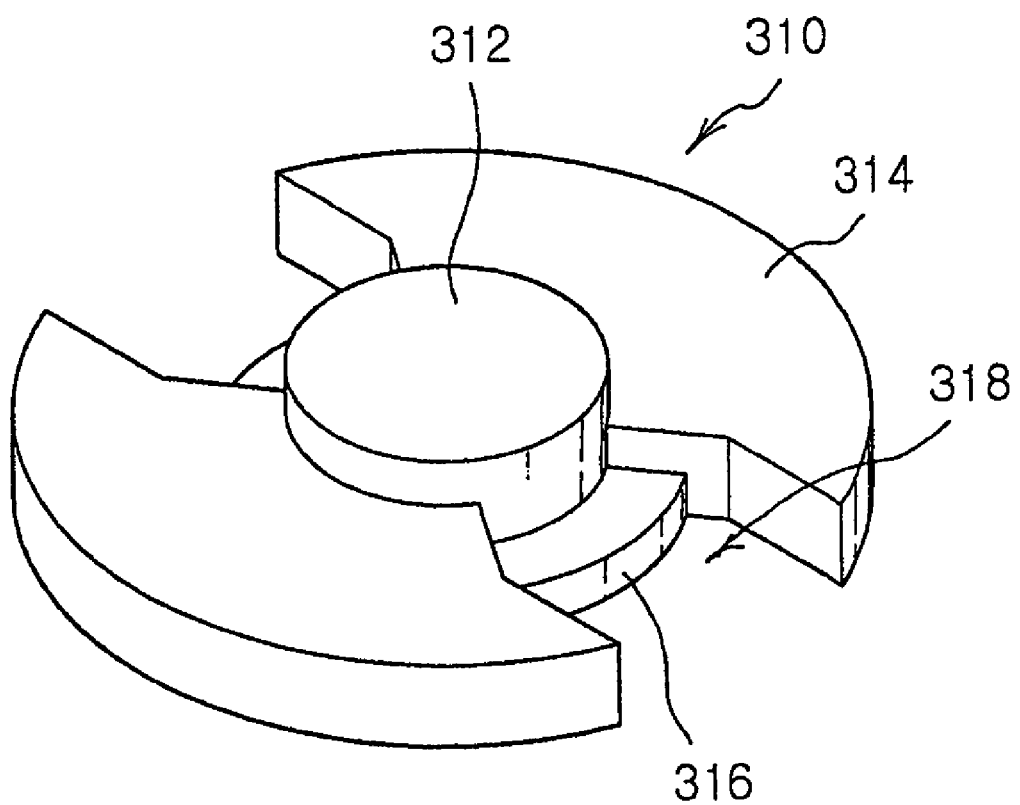
FIG. 27 is a perspective view of a heat conductive member shown in FIG. 26.
Figure 28:
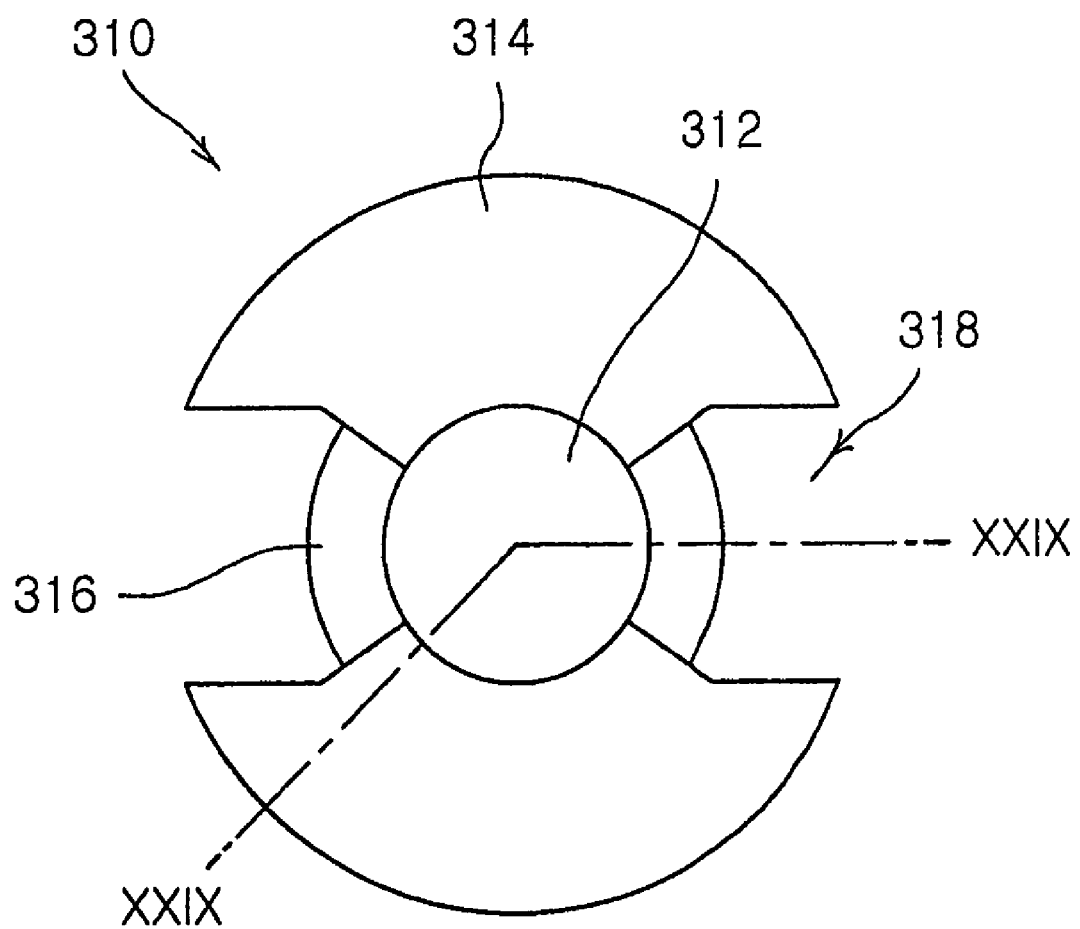
FIG. 28 is a plan view of the heat conductive member shown in FIG. 27.
Figure 29:
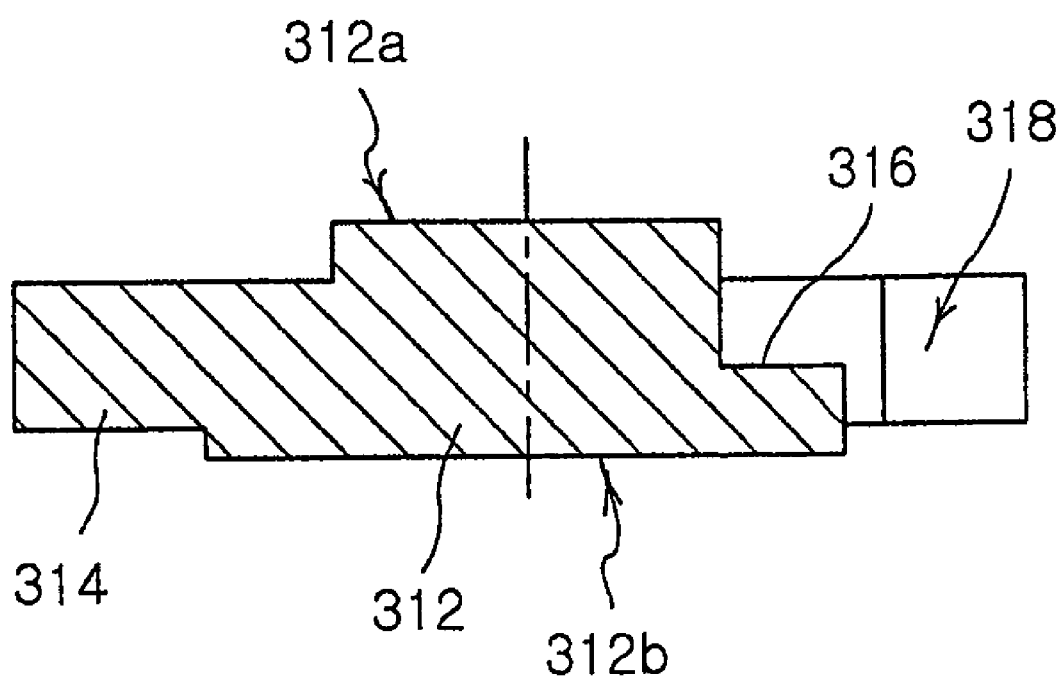
FIG. 29 is a cross-sectional view taken along the line XXIX-XXIX in FIG. 28.
Figure 30:
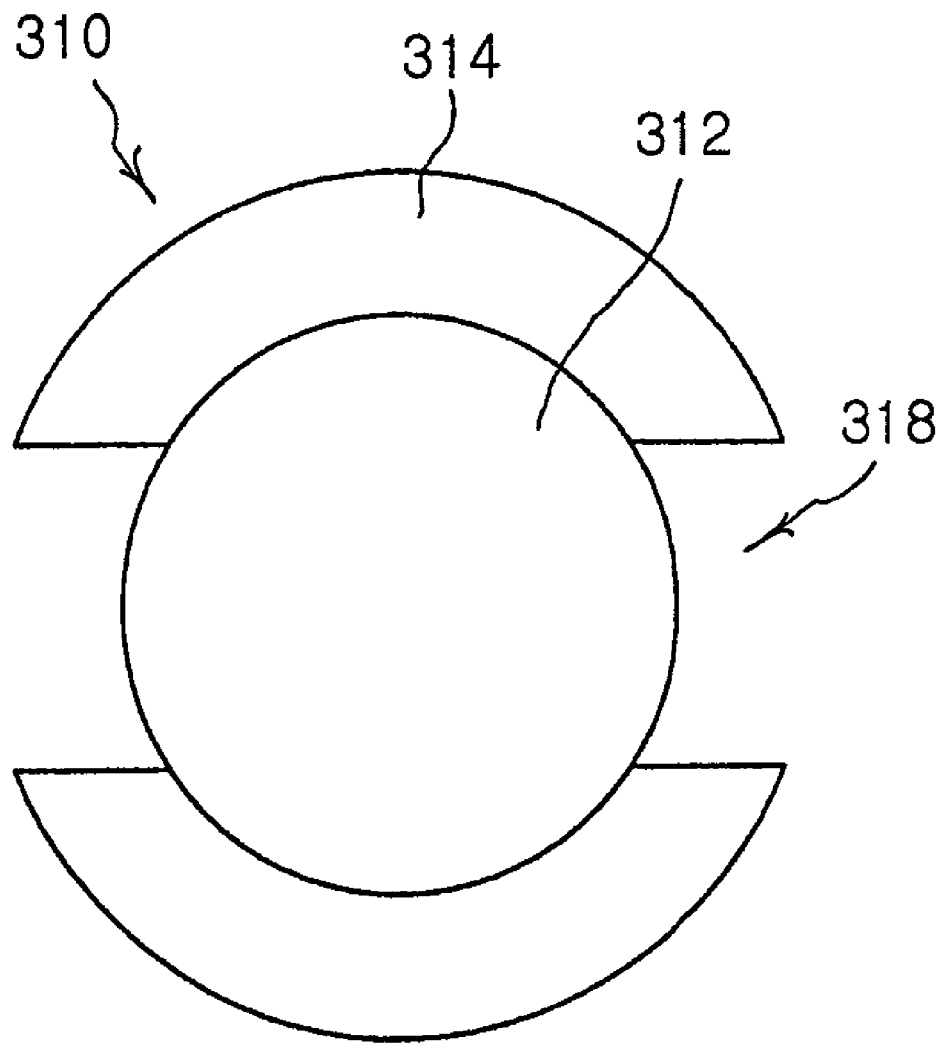
FIG. 30 is a bottom view of the heat conductive member shown in FIG. 27.

FIG. 21 illustrates a third embodiment of the LED package according to the invention. As shown in FIG. 21, in the LED package 200-1 of this embodiment, a heat conductive member 212 and a lead-coating assembly 220 of a LED package frame 210-1 are substantially the same as the heat conductive member 110 and the lead-coating assembly 120 of the LED package frame 100 shown in FIGS. 1 to 11. So, the same reference signs are used to designate the same components without repeatedly describing them.

Unlike the LED package 200 shown in FIGS. 18 to 20, a reflector R of this embodiment is formed by the inside surface of a molded outside wall 230. The outside wall 230 is made of nonconductor such as resin, in which any material containing at least one of Ni, Ag and Au may be plated or coated on the inside surface of the outside wall 230 to form the reflector R. A cavity C is formed inside the outside wall 230, and filled with transparent resin to protect the LED chip 202 from outside.

FIGS. 22 to 32 illustrate a fourth embodiment of the LED package frame according to the invention. As shown in FIGS. 22 to 32, the LED package frame 300 of this embodiment includes an LED chip 302, a heat conductive member 310 mounted with the LED chip 302 and a pair of lead-coating assemblies 320 inserted into the heat conductive member 310.

Referring to FIGS. 27 to 30 first, the heat conductive member 310 is a lump of high heat conductivity material, and has an overall disk-shaped configuration with a protruded central portion. The material of the heat conductive member 310 may be any of Cu, Ag, Al, Mo, Fe, Ni, W and alloys thereof. Alternatively, the heat conductive member 310 may be plated or coated with any one of Ni, Ag, Au and alloys thereof.

A column part 312 is formed in the center of the heat conductive member 110, and a pair of periphery parts 314 and a pair of steps 116 are formed around the column part 312. The periphery parts 314 are integrally extended outward from the column part 312. The periphery parts 314 are separated from each other by receiving parts 318 but connected together by the steps 316. The receiving parts 318 function to receive the lead-coating assemblies 320.

Figure 31:
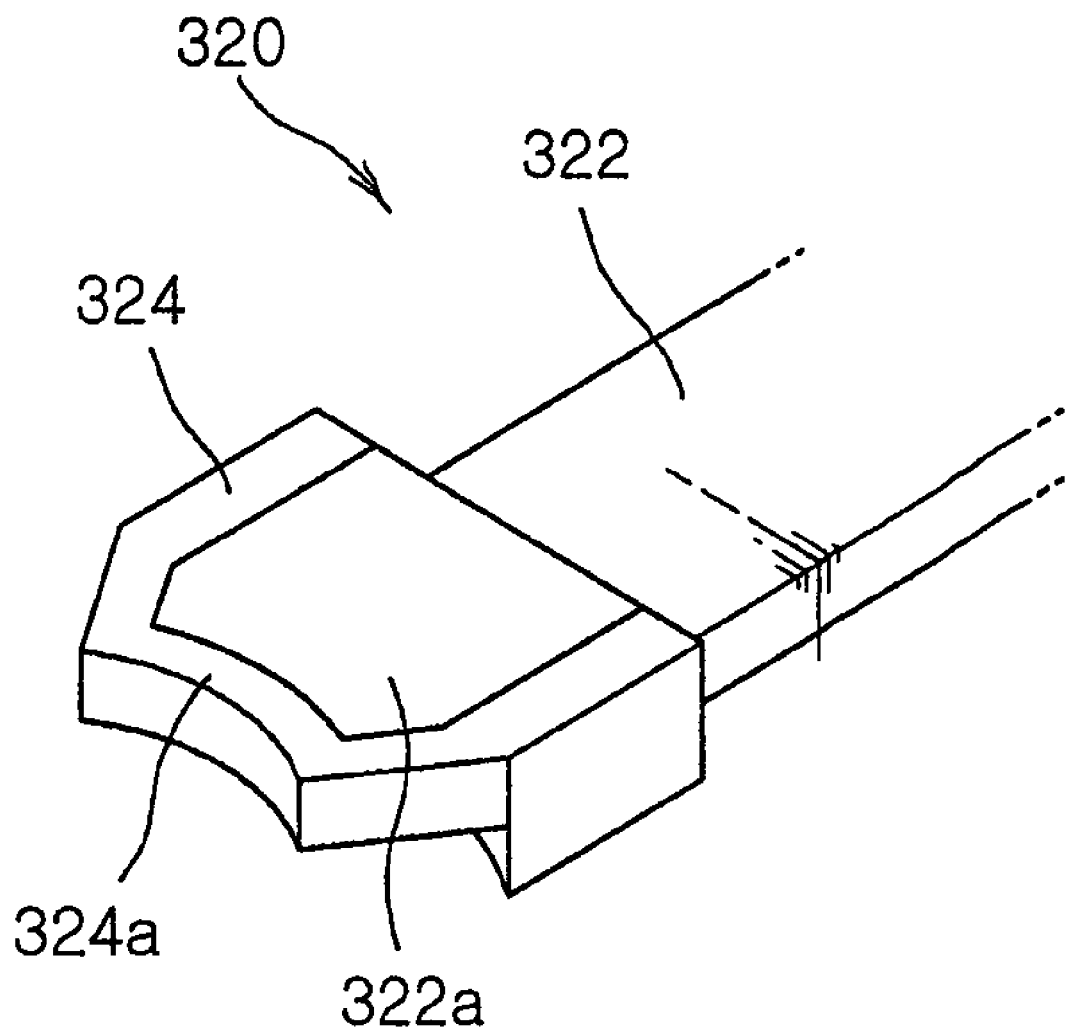
FIG. 31 is a perspective view of a lead-coating assembly of the LED package frame shown in FIG. 26.
Figure 32:
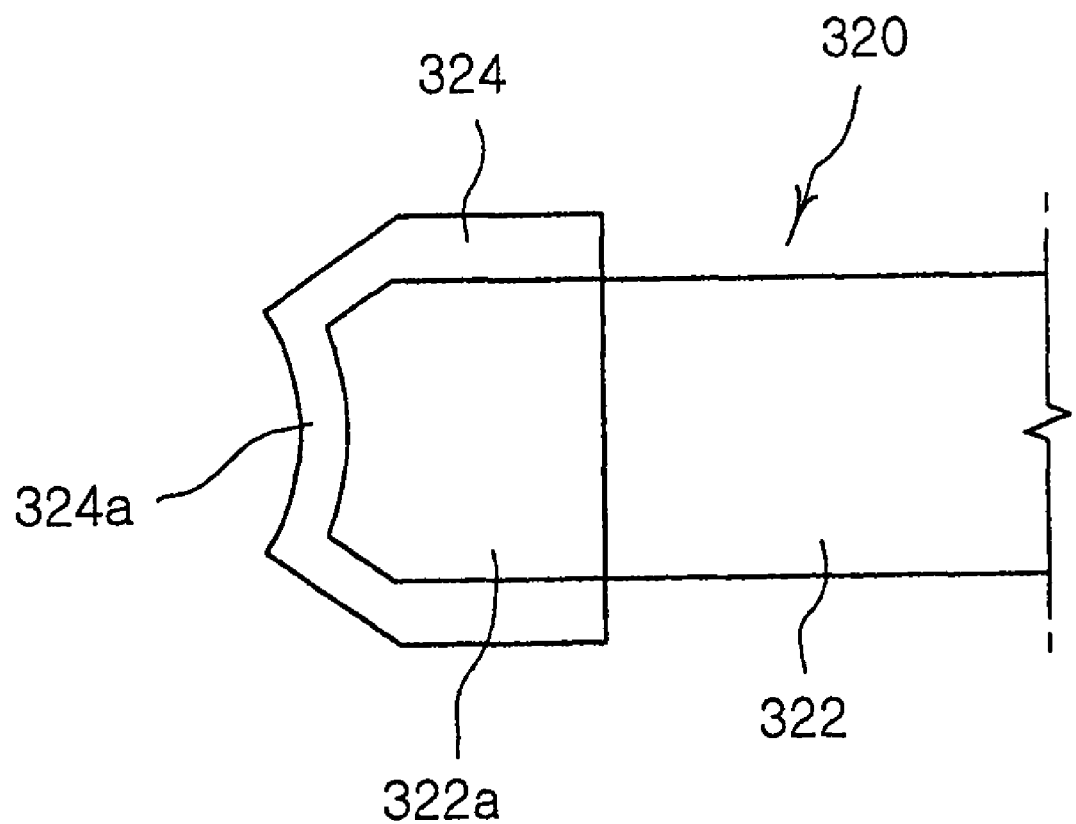
FIG. 32 is a plan view of the lead-coating assembly shown in FIG. 31.
Figure 33:
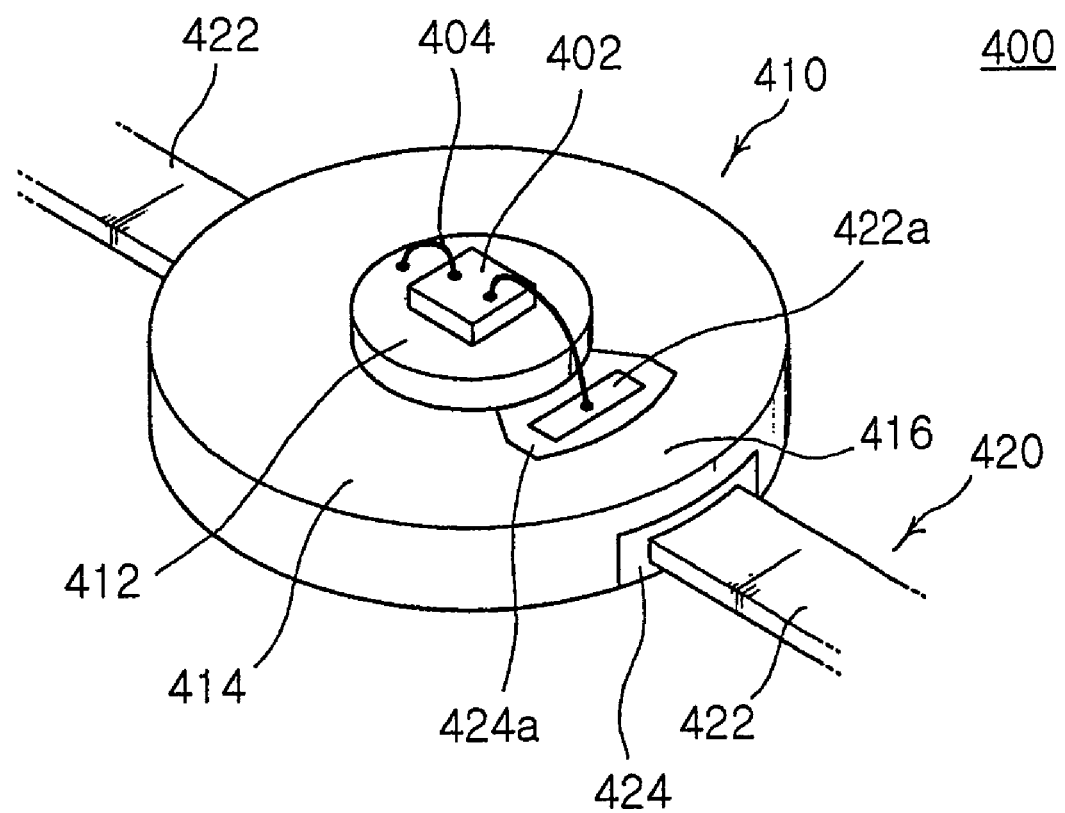
FIG. 33 is a perspective view illustrating a fifth embodiment of the LED package frame according to the invention.
Figure 34:
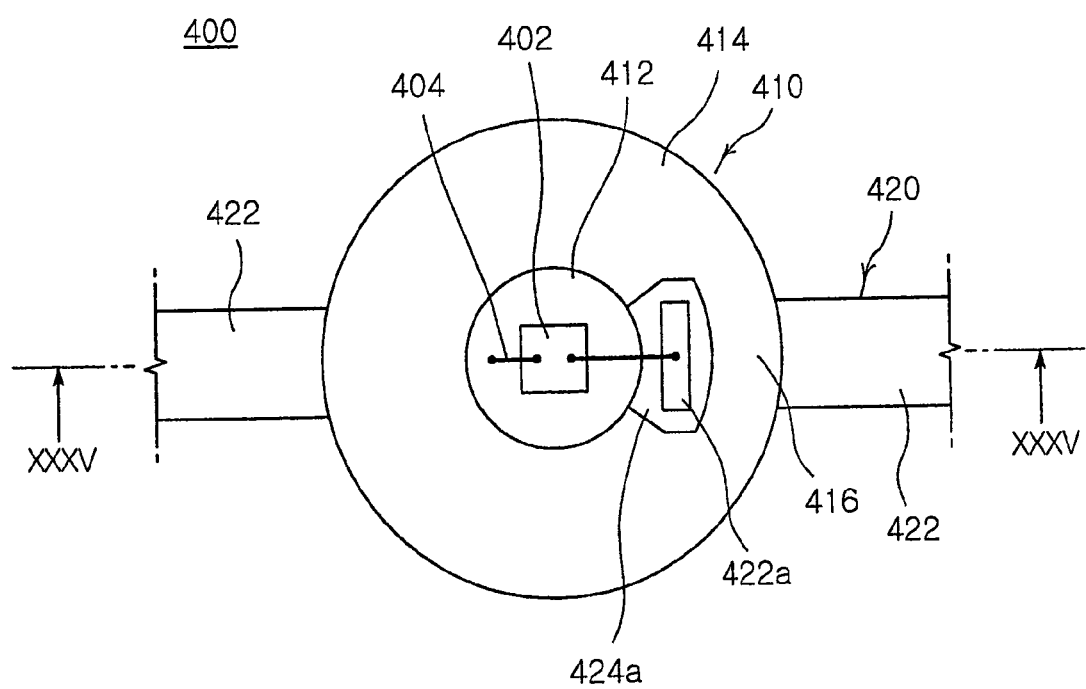
FIG. 34 is a plan view of the LED package frame shown in FIG. 33.

Now referring to FIGS. 31 and 32, each of the lead-coating assemblies 320 includes a lead 322 made of high electric conductivity metal and an isolating layer or insulation coating 324 coated on the lead 322 around the front end 322a thereof. The lead 322 has a step-up configuration with the front end 322a extended upward, and the insulation coating 324 is attached to lateral, bottom and front portions of the lead front end 322a. In particular, a portion of the insulation coating 324 attached to the front portion of the lead front end 322a will be referred to as a coating front end 324a.

The lead 322 may be made of any one of Cu, Ni, Fe and alloys thereof. Alternatively, the lead 322 may be coated with any one of Ni, Ag, Au and alloys thereof. The insulation coating 324 is made of any one of glass, LCP, epoxy and so on, and preferably selected from any materials that is deformable at a high temperature.

Examining the assembled LED package frame 300, each lead 322 is inserted into each receiving part 318 of the heat conductive member 310. The insulation coating 324 is interposed between the lead front end 322 and the periphery part 314 to prevent any contact between them. The insulation coating front end 324a is interposed between the lead front end 322a and the column part 312, more particularly, between the lead front end 322a and the lateral face of the column part 312 and between the lead front end 322a and the step 316, thereby preventing any contact between them. This prevents the lead 322 from directly contacting the heat conductive member 310. Furthermore, the insulation coating 324 is deformable at a high temperature to seal and bond between the lead 322 and the heat conductive member 310.

The LED chip 302 is fixed onto a column top 312a of the heat conductive member 310, preferably by adhesive and so on. The LED chip 302 is also electrically connected to the lead front ends 322a of the lead-coating assemblies 320 by wires 304.

Alternatively, the LED chip 302 may be mounted on the heat conductive member 310 by mounting a pattern-printed pad on the column top 312a, seating the LED chip 302 on the pad, connecting the LED chip 302 to the pad by wires or solder bumps, and then connecting patterns of the pad to the lead front ends 322a by wires. Preferably, the pad is made of flexible or soft material to protect the LED chip 302 from external impact.

The package frame 300 of the invention can reduce the entire size remarkably since the lead-coating assembly 320 is coupled with the heat conductive member 310 through the insertion into the receiving part 318 thereof. Also, the insulation coating 324 and the coating front end 324a function to prevent the lead front end 322a of the lead-coating assembly 320 from directly contacting the heat conductive member 310. So, a plurality of package frames 300 of the invention can be mounted on a metal PCB without causing any short-circuit.

The package frame 300 of this embodiment can be modified into a configuration as of the package frame 100-1 shown in FIG. 14. That is, an insulation coating may be omitted from one lead 122 so that this lead 112 is directly connected to the heat conductive member 310 and the LED chip 102 is electrically connected to the column part 312 of the heat conductive member 310 by a wire 104. This as a result enables the heat conductive member 310 function as a lead.

The package frame 300 of this embodiment can also be applied to the LED package 150 as shown in FIGS. 16 and 17 in order to more stably maintain the coupling between the heat conductive member 310 and the lead-coating assemblies 320 while protecting the LED chip 302 and so on from outside with the resin-molded package body 130.

Furthermore, the package frame 300 of this embodiment can also be applied to the LED package 200 as shown in FIGS. 18 to 20 and the LED package 200-1 as shown in FIG. 21.

FIGS. 33 to 37 illustrate a fifth embodiment of the LED package frame according to the invention. As shown in FIGS. 33 to 37, the LED package frame 400 of this embodiment includes an LED chip 402, a heat conductive member 410 mounted with the LED chip 402. The LED package frame 400 also includes a lead-coating assembly 420 and a lead 422 inserted into the heat conductive member 410.

The LED chip 402 is attached to the top of a column part 412 of the heat conductive member 410, preferably, by adhesive and so on, and electrically connected to the column part 412 and the front end 422a of the lead 422 by wires 404.

The heat conductive member 410 is a lump of high heat conductivity material, and has an overall disk-shaped configuration with a protruded central portion. The material of the heat conductive member 410 may be any of Cu, Ag, Al, Mo, Fe, Ni, W and alloys thereof. Alternatively, the heat conductive member 410 may be plated or coated with any one of Ni, Ag, Au and alloys thereof.

A cylindrical column part 412 is formed in the center of the heat conductive member 410, and an annular periphery part 414 is formed around the column part 412. The periphery part 414 has an L-shaped first receiving part 418a positioned in the right side of the drawing and a stopper 416 formed above the first receiving part 418a.

The first receiving part 418a is extended vertically along the column part 412 through the periphery part 414 to open a corresponding lower portion of the periphery part 414. A second receiving part 418b is formed opposite to the first receiving part 418a about the column part 412, in a lower portion of the periphery part. The first receiving part 418a receives the lead-coating assembly 420 and the second receiving part 418b receives only the lead 422.

The lead-coating assembly 420 includes a lead 422 made of high electric conductivity metal and an isolating layer or insulation coating 424 coated on the front end 422a of the lead 422. The lead 422 has an L-shaped configuration bent upward toward the front end 422a, and the insulation coating 424 is attached to the lead front end 422a to surround it except for a top portion thereof. In particular, a portion of the insulation coating 424 attached to the front face of the lead front end 422a will be referred to as a coating front end 424a.

The lead 422 may be made of any one of Cu, Ni, Fe and alloys thereof, or coated with any one of Ni, Ag, Au and alloys thereof. The insulation coating 424 is made of any one of glass, LCP, epoxy and so on, and preferably selected from any materials that is deformable at a high temperature.

Figure 37:
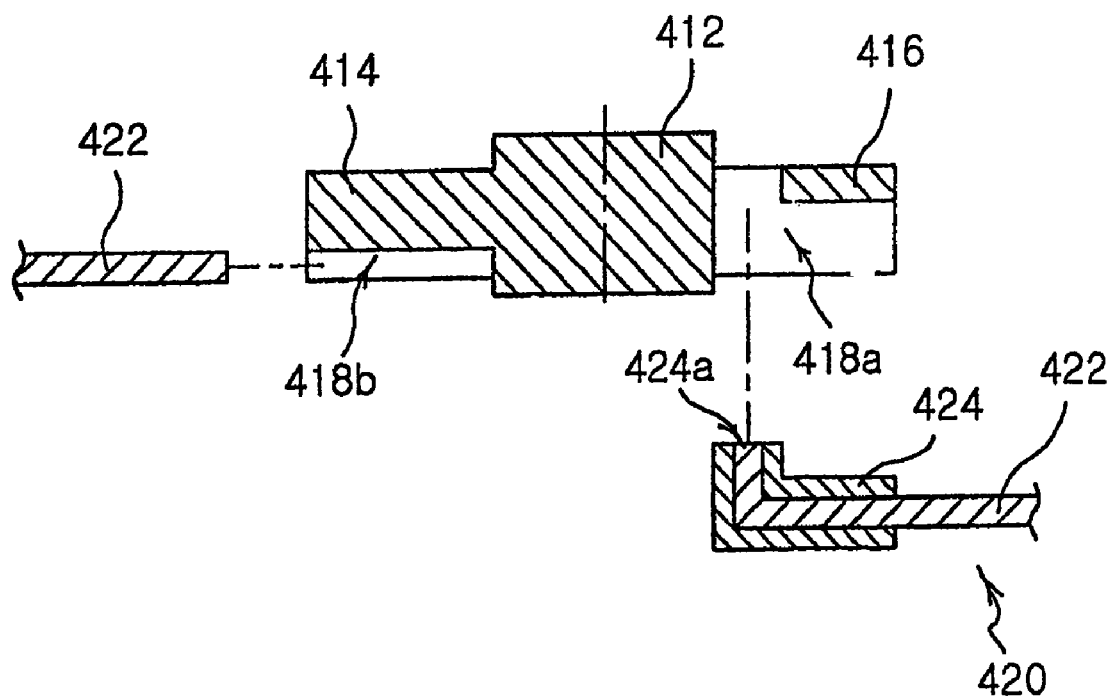
FIG. 37 is an exploded cross-sectional view illustrating an assembly process of the LED package frame shown in FIG. 33.

Now examining the assembled LED package frame 400, the lead-coating assembly 420 is inserted by its terminal portion into the first receiving part 418a of the heat conductive member 410. As shown in FIG. 37, the lead-coating assembly 420 is inserted from below to above into the first receiving part 418a of the heat conductive member 410.

Then, the insulation coating 424 prevents the lead 422 and the lead front end 422a from contacting the column part 410 or the periphery part 414. Also, the insulation coating 424 is deformable at a high temperature to seal and bond between the lead 422 and the heat conductive member 410.

Figure 35:
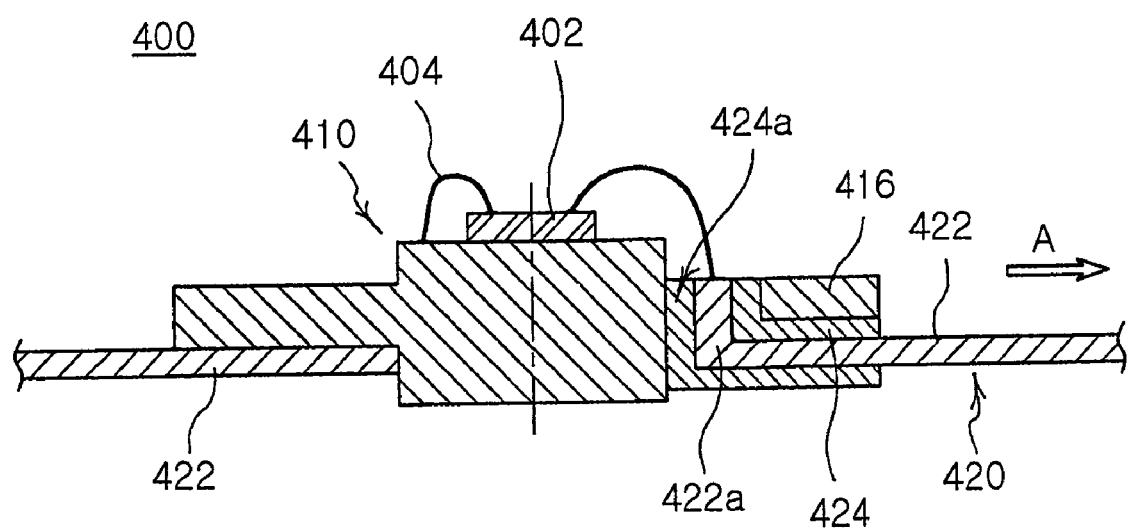
FIG. 35 is a cross-sectional view taken along the line XXXV-XXXV in FIG. 34.
Figure 36:
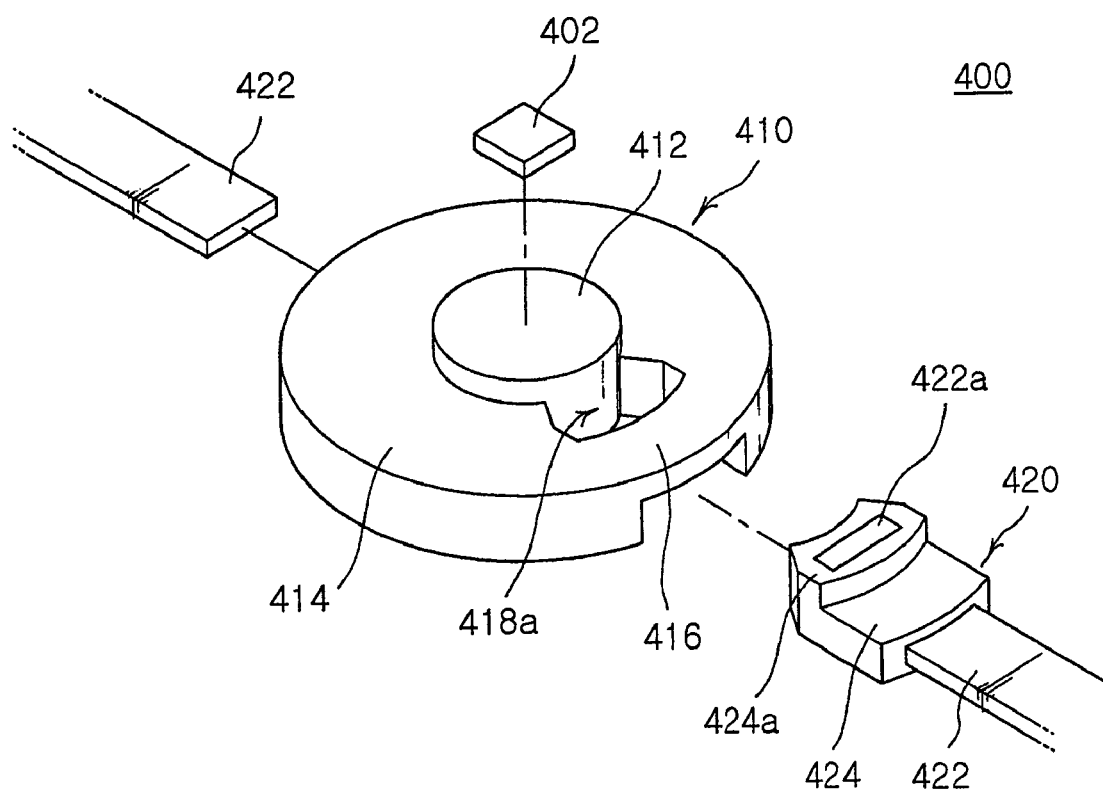
FIG. 36 is an exploded perspective view of the LED package frame shown in FIG. 33.

Then, as shown in FIG. 35, the stopper 416 of the periphery part 414 can prevent the lead-coating assembly 420 from moving in direction of arrow B so that the lead-coating assembly 420 are more stably kept in the first receiving part 418.

The second receiving part 418b receives the lead 422 by itself. As shown in FIG. 37, the lead 422 is inserted horizontally into the second receiving part 418b to directly contact the heat conductive member 410. As a result, the lead 422 can transmit power to the LED chip 402 via the heat conductive member 410 and the wire 404. Alternatively, the heat conductive member 410 can be directly connected with an external power source to function as a lead.

Constructing the package frame 400 of this embodiment as above allows the lead-coating assembly 420 to be easily inserted into and maintain stably coupling with the heat conductive member 410, thereby improving productivity.

With the package frame 400 of this embodiment, it is possible to reduce the entire size remarkably since the lead-coating assembly 420 is coupled with the heat conductive member 410 through the insertion into the first receiving part 418a.

Also, the insulation coating 424 and the coating front end 424a function to prevent the lead front end 422a of the lead-coating assembly 420 from directly contacting the heat conductive member 410. So, a plurality of package frames 400 of the invention can be mounted on a metal PCB without causing any short-circuit.

The package frame 400 of this embodiment can be modified into various shapes. For example, the second receiving part 418b can be shaped the same as the first receiving part 418a to receive a pair of lead-coating assemblies. Then, the lead-coating assemblies can be used as terminals so that the heat conductive member performs only heat conduction function. Otherwise, the heat conductive member may be used as one terminal while both of the lead-coating assemblies are used in common as the other terminal. It is also possible to have a lead-coating assembly inserted into one of the L-shaped receiving parts and an L-shaped lead inserted into the other one of the L-shaped receiving parts.

The package frame 400 of this embodiment can be applied to the LED package 150 shown in FIGS. 16 and 17 in order to more stably maintain the coupling of the heat conductive member 410 with the lead-coating assembly 420 and the lead 422 while protecting the LED chip 402 and so on from outside with the resin-molded package body 130.

In addition, the package frame 400 of this embodiment can also be applied to the LED package 200 shown in FIGS. 18 to 20 and the LED package 200-1 shown in FIG. 21.

As described hereinbefore, the present invention can reduce the size of LED package frames and high power LED packages while maintaining high heat conductivity and stability by inserting a lead into a heat conductive member.

The invention can also enable mass production of LED package frames and high power LED packages by fixing a lead portion to a heat conductive member without a jig.

While the present invention has been shown and described in connection with the preferred embodiment, it is to be understood that those skilled in the art can make various modifications and variations to the present invention without departing from the spirit and scope of the appended claims.

What is claimed is:

1. A Light Emitting Diode (LED) package comprising:
an LED chip;
a heat conductive member made of high heat conductivity material, wherein the heat conductive member comprising a central column, a plate member extending around the central column and integral with the central column, a circumference of the plate has a cutout to define a receiving part, an upper flat surface of the plate member has an opening the opens downwardly into the receiving part;
a lead extending through the receiving part and exposed in the opening;
an insulating layer placed in contact between the lead and the head conductive member;
a wire extending through the opening to connect the LED chip and the exposed lead; and
a package body made of resin to seal the heat conductive member and a part of the lead to an extent that at least a part of the heat conductive member opposite to the LED chip is exposed and the other end of the lead is projected out of the package body.

2. A Light Emitting Diode (LED) package comprising:
an LED chip;
a heat conductive member made of high heat conductivity material, wherein the heat conductive member comprising a central column, a plate member extending around the central column and integral with the central column, a circumference of the plate has a cutout to define a receiving part, an upper flat surface of the plate member has an opening the opens downwardly into the receiving part;
a lead extending through the receiving part and exposed in the opening;
an insulating layer placed in contact between the lead and the head conductive member;
a wire extending through the opening to connect the LED chip and the exposed lead; and
an outside wall injection-molded sealing the periphery of the heat conductive member and partially the lead in a portion adjacent to the heat conductive member while forming a cavity therein.

3. The LED package according to claim 2, further comprising a transparent resin filled in the cavity.

4. The LED package according to claim 3, further comprising a layer of high reflectivity material formed on an inside surface of the outside wall.

5. A Light Emitting Diode (LED) package comprising:
an LED chip;
a heat conductive member made of a lump of high heat conductivity material, wherein the heat conductive member has a receiving part at a lateral portion, and the LED chip is mounted on the heat conductive member;
a first lead inserted at one end into the receiving part of the heat conductive member, and electrically connected to the LED chip;
a second lead extending through the receiving part and exposed in the opening;

an insulating layer placed in contact between the second lead and the heat conductive member;

a wire extending through the opening to connect the LED chip and the exposed lead; and an outside wall injection-molded sealing the periphery of the heat conductive member and partially the lead in a portion adjacent to the heat conductive member while forming a cavity therein.

6. The LED package according to claim 5, further comprising a transparent resin filled in the cavity.

7. The LED package according to claim 5, further comprising a layer of high reflectivity material formed on an inside surface of the outside wall.

\* \* \* \* \*